(12) United States Patent
Blank et al.

(10) Patent No.: US 11,151,916 B2
(45) Date of Patent: Oct. 19, 2021

(54) DATA SHIFTING CIRCUIT FOR A CURRENT MODE DISPLAY

(71) Applicant: Facebook Technologies, LLC, Menlo Park, CA (US)

(72) Inventors: William Thomas Blank, Bellevue, WA (US); Ilias Pappas, Cork (IE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/761,767

(22) PCT Filed: Nov. 1, 2018

(86) PCT No.: PCT/US2018/058804
§ 371 (c)(1),
(2) Date: May 5, 2020

(87) PCT Pub. No.: WO2019/103821
PCT Pub. Date: May 31, 2019

(65) Prior Publication Data
US 2020/0372846 A1    Nov. 26, 2020

(30) Foreign Application Priority Data

Nov. 23, 2017  (GR) .............................. 20170100527
Sep. 7, 2018   (GR) .............................. 20180100411

(51) Int. Cl.
*G09G 3/02*     (2006.01)
*G11C 19/28*    (2006.01)
(Continued)

(52) U.S. Cl.
CPC ............ *G09G 3/025* (2013.01); *G11C 13/04* (2013.01); *G11C 19/184* (2013.01); *G11C 19/28* (2013.01);
(Continued)

(58) Field of Classification Search
CPC ............ G09G 3/02; G09G 2340/0407; G09G 2354/00; G09G 3/003; G09G 3/002;
(Continued)

(56) References Cited

U.S. PATENT DOCUMENTS 4,609,927 A * 9/1986 Yoshida .................. G06K 15/14
347/142
4,855,760 A * 8/1989 Kanayama ......... G06K 15/1247
347/240

(Continued)

FOREIGN PATENT DOCUMENTS

CN    111527538         8/2020
CN    112166469 A       1/2021
(Continued)

OTHER PUBLICATIONS

U.S. Appl. No. 16/178,510, "Non-Final Office Action" dated Feb. 20, 2020, 21 pages.
(Continued)

*Primary Examiner* — Olga V Merkoulova
(74) *Attorney, Agent, or Firm* — Weaver Austin Villeneuve & Sampson LLP

(57) ABSTRACT

Techniques are described for operating a display comprising an array of emitters arranged in at least one column. A data shifting circuit stores digital data or an analog representation thereof in a first storage element. The data shifting circuit outputs the digital data or analog representation multiple times to a display driver circuit, using a multiplexer. The first storage element can be a shift register or a capacitor. Digital data can be internally shifted within the data shifting circuit, through multiple shift registers, prior to output to the display driver circuit. An analog representation can be stored and read from the same capacitor without internal shifting. The display driver circuit drives a different emitter of the column each time. A scanning assembly including a reflective sur-
(Continued)

face that receives light from the emitter array forms an output image by rotating the reflective surface in synchronization with driving of the emitters.

19 Claims, 25 Drawing Sheets

(51) Int. Cl.
 *G11C 19/18* (2006.01)
 *G11C 13/04* (2006.01)
 *G11C 19/34* (2006.01)
 *G11C 19/30* (2006.01)
(52) U.S. Cl.
 CPC .............. *G11C 19/30* (2013.01); *G11C 19/34* (2013.01); *G09G 2310/0286* (2013.01); *G09G 2320/0693* (2013.01)
(58) Field of Classification Search
 CPC ....... G09G 2380/10; G09G 2320/0626; G09G 2320/064; G09G 3/346; G09G 3/20; G09G 2360/16; G09G 2300/026; G09G 3/025
 See application file for complete search history.

(56) References Cited

U.S. PATENT DOCUMENTS

| | | | |
|---|---|---|---|
| 5,331,333 A | 7/1994 | Tagawa et al. | |
| 5,612,728 A * | 3/1997 | Kun | B41J 2/45 347/232 |
| 5,710,506 A * | 1/1998 | Broell | H02J 7/00711 320/145 |
| 6,720,942 B2 | 4/2004 | Lee et al. | |
| 6,771,232 B2 | 8/2004 | Fujieda et al. | |
| 7,355,574 B1 | 4/2008 | Leon et al. | |
| 10,861,380 B2 | 12/2020 | Horowitz et al. | |
| 10,971,061 B2 | 4/2021 | Blank et al. | |
| 2004/0251973 A1* | 12/2004 | Ishida | H03L 7/0816 331/16 |
| 2007/0080905 A1* | 4/2007 | Takahara | G09G 3/3233 345/76 |
| 2007/0242002 A1 | 10/2007 | Kawabe | |
| 2009/0040198 A1 | 2/2009 | Lu et al. | |
| 2009/0051712 A1 | 2/2009 | Arai et al. | |
| 2010/0026214 A1 | 2/2010 | Nagumo | |
| 2010/0124438 A1* | 5/2010 | Nagumo | G03G 15/04054 399/220 |
| 2011/0043541 A1* | 2/2011 | Cok | G09G 3/006 345/690 |
| 2011/0234741 A1* | 9/2011 | Nagumo | B41J 2/435 347/224 |
| 2013/0169697 A1 | 7/2013 | Park et al. | |
| 2013/0222774 A1 | 8/2013 | Chikaoka | |
| 2015/0077414 A1 | 3/2015 | Yoo et al. | |
| 2015/0186098 A1* | 7/2015 | Hall | H05K 5/0017 345/1.3 |
| 2015/0243068 A1 | 8/2015 | Solomon | |
| 2016/0198533 A1* | 7/2016 | Williams | H05B 45/3725 315/185 R |
| 2016/0252742 A1 | 9/2016 | Wakabayashi | |
| 2016/0330418 A1 | 11/2016 | Nakai et al. | |
| 2017/0214907 A1 | 7/2017 | Lapstun | |
| 2017/0236463 A1 | 8/2017 | Chi et al. | |
| 2018/0182279 A1* | 6/2018 | Sakariya | G09G 3/2081 |
| 2019/0064526 A1* | 2/2019 | Connor | G02B 6/0073 |
| 2019/0094667 A1 | 3/2019 | Morarity et al. | |
| 2019/0156720 A1 | 5/2019 | Blank et al. | |
| 2019/0156721 A1 | 5/2019 | Blank et al. | |
| 2019/0347981 A1 | 11/2019 | Horowitz et al. | |
| 2020/0184868 A1 | 6/2020 | Shen et al. | |
| 2020/0226977 A1 | 7/2020 | Blank et al. | |

FOREIGN PATENT DOCUMENTS

| | | |
|---|---|---|
| EP | 2610846 A2 | 7/2013 |
| EP | 3151226 A1 | 4/2017 |
| EP | 3794579 | 3/2021 |
| WO | 2016196390 A1 | 12/2016 |
| WO | 2019103821 | 5/2019 |
| WO | 2019222229 | 11/2019 |

OTHER PUBLICATIONS

U.S. Appl. No. 16/178,505, "Non-Final Office Action" dated Feb. 20, 2020, 14 pages.
U.S. Appl. No. 16/410,620, "Non-Final Office Action" dated Feb. 20, 2020, 14 pages.
International Application No. PCT/US2019/032237, International Search Report and Written Opinion dated Jul. 30, 2019, 13 pages.
International Search Report and Written Opinion—PCT/US2018/058804—ISA/KR—dated Feb. 21, 2019 (12 pp.).
US Notice of Allowance dated Nov. 25, 2020 in U.S. Appl. No. 16/274,143.
U.S. Office Action dated Mar. 9, 2020, in U.S. Appl. No. 16/410,620.
US Final Office Action dated Jul. 6, 2020, in U.S. Appl. No. 16/178,505.
US Final Office Action dated Jul. 7, 2020, in U.S. Appl. No. 16/178,510.
US Notice of Allowance dated Jul. 27, 2020, in U.S. Appl. No. 16/410,620.
International Preliminary Report On Patentability—PCT/US2018/058804—ISA/KR—dated May 26, 2020.
Notice of Allowance dated Oct. 22, 2020 in U.S. Appl. No. 16/178,505.
Notice of Allowance dated Oct. 23, 2020 in U.S. Appl. No. 16/178,510.
US Non-Final Office Action dated Jul. 9, 2020 in U.S. Appl. No. 16/274,143.
International Application No. PCT/US2019/032237, International Preliminary Report on Patentability dated Nov. 17, 2020.
EP Application No. 19732768.7, "Communication Pursuant to Article 94(3) EPC", Jun. 14, 2021, 8 pages.

* cited by examiner

DATA SHIFTING CIRCUIT FOR A CURRENT MODE DISPLAY

CROSS-REFERENCE TO RELATED APPLICATIONS

This application is a national phase application of PCT Application No. PCT/US2018/058804, filed Nov. 1, 2018, entitled "Data Shifting Circuit For A Current Mode Display," which claims the benefit and priority of Greece Patent Application No. 20180100411, filed Sep. 7, 2018, entitled "Feedback Circuit For Calibrating A Current Mode Display," and Greece Patent Application No. 20170100527, filed Nov. 23, 2017, entitled "Current Mode Active Matrix Analysis." The contents of each of the above-listed applications are incorporated herein by reference in their entirety for all purposes.

BACKGROUND

In certain types of display systems, it is sometimes desirable to control different light emitters to generate the same output. For example, the same color and/or intensity may be output by different emitters in consecutive clock cycles or image frames. If the inputs of each emitter are independently generated, the data bandwidth for supplying the inputs to the emitters can become very high. In some cases, the data bandwidth may exceed what the display system can support, so that data cannot be input to the emitters fast enough to permit the display to operate as intended.

BRIEF SUMMARY

The present disclosure relates to techniques for controlling a display comprising a plurality of light emitters by shifting input data between the light emitters. The techniques described herein enable efficient transmission of input data in connection with the operation of the display. Various data shifting arrangements are described, including analog circuit implementations and digital circuit implementations. The embodiments described herein may be used in various combinations. For example, a digital data shifter can be used in combination with an analog emitter circuit or in combination with a digital emitter circuit. The combinations described herein are therefore to be taken as illustrative.

Techniques are described for operating a display comprising an array of emitters arranged in at least one column. In certain embodiments, a data shifting circuit stores digital data or an analog representation thereof in a first storage element. The data shifting circuit can output the digital data or analog representation multiple times to a display driver circuit, e.g., using a multiplexer. The first storage element can be a shift register or a capacitor. In certain embodiments, digital data can be internally shifted within the data shifting circuit, e.g., through multiple shift registers, prior to output to the display driver circuit. In certain embodiments, an analog representation can be stored and read from the same capacitor without internal shifting.

In certain embodiments, a display system includes an emitter array, a display driver circuit, and a data shifting circuit. The emitter array includes a plurality of emitters arranged in a column. The display driver circuit is configured to individually drive the plurality of emitters. The data shifting circuit includes a plurality of storage elements and a multiplexer. The data shifting circuit is configured to: store digital data or an analog representation of the digital data into a first storage element of the plurality of storage elements; and output the digital data or analog representation to the display driver circuit from the multiplexer. The digital data or analog representation is output multiple times. The display driver circuit uses the digital data or analog representation to drive a different emitter of the plurality of emitters each time the digital data or analog representation is output from the multiplexer.

In certain embodiments, a data shifting circuit for driving a plurality of emitters in a display includes a plurality of storage elements and a multiplexer. The plurality of storage elements include a first storage element configured to store digital data or an analog representation of the digital data. The multiplexer is configured to output the digital data or analog representation to a display driver circuit multiple times. The display driver circuit uses the digital data or analog representation to drive a different emitter of the plurality of emitters each time the digital data or analog representation is output from the multiplexer.

In certain embodiments, a display system includes an emitter array, a display driver circuit, a scanning assembly, and a data shifting circuit. The emitter array includes a plurality of emitters arranged in a column, wherein the plurality emitters are of a same color. The display driver circuit is configured to individually drive the plurality of emitters using digital data values or analog representations of digital data values. The scanning assembly includes a reflective surface that receives light from the emitter array, the scanning assembly forming an output image by rotating the reflective surface in synchronization with driving of the plurality of emitters. The data shifting circuit is located separately from the emitter array and includes a plurality of storage elements that collectively provide storage for the entire column. The data shifting circuit is configured to: receive digital data or an analog representation of the digital data; store the digital data or analog representation into a first storage element of the plurality of storage elements; and output the digital data or analog representation to the display driver circuit multiple times. The digital data or analog representation is output once for each emitter of the plurality of emitters. Each time the digital data or analog representation is output, the display driver circuit uses the digital data or analog representation to drive a different emitter such that, over time, each emitter of the plurality of emitters is driven using the digital data or analog representation.

BRIEF DESCRIPTION OF THE DRAWINGS

Illustrative embodiments are described with reference to the following figures.

Figure 1:
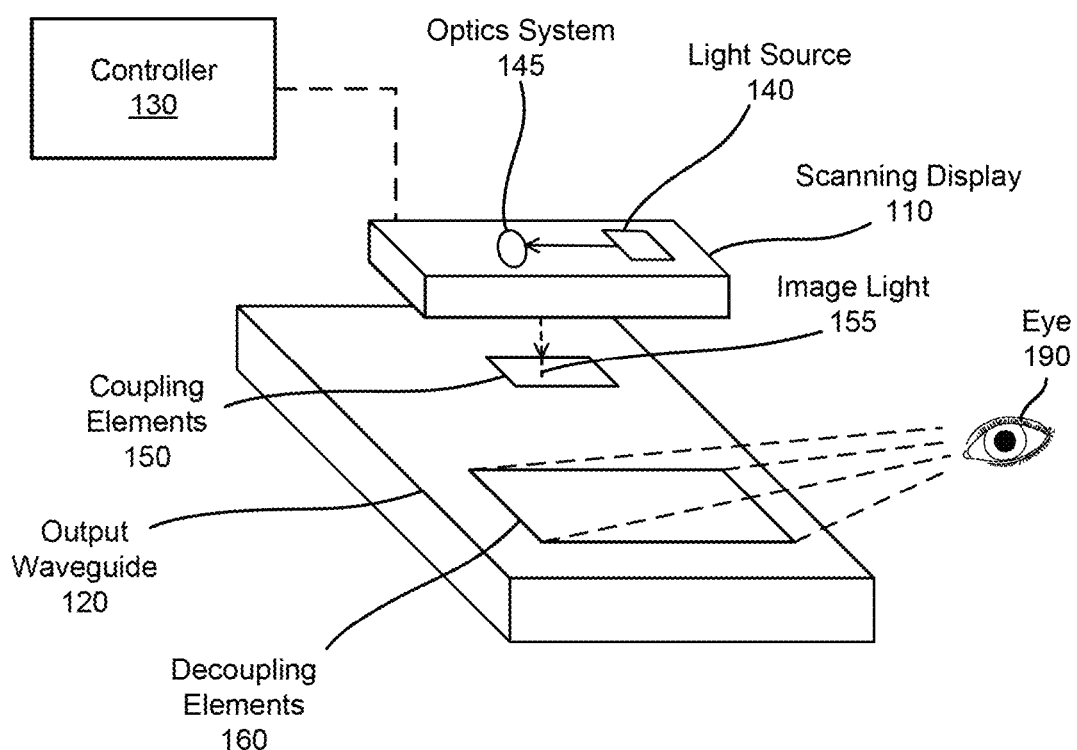
FIG. 1 shows a waveguide assembly for implementing one or more embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

In the appended figures, certain naming conventions have been applied for convenience, such as the letter "M" followed by a numeral to identify a particular transistor in a circuit, or the letter "C" followed by a numeral to identify a particular capacitor in a circuit. The same text label may be applied to different components. Where appropriate, reference numerals have been added for clarity. For example, M1 in one figure may refer to a different transistor than M1 in another figure unless both M1s are marked with the same reference numeral.

The terms "row" and "column" are used herein to refer to a physical arrangement of emitters and/or emitter related circuitry into groups, and are sometimes used together to differentiate between two spatial dimensions that are orthogonal to each other. Rows and columns are generally interchangeable and should not be taken to refer to any particular dimension. For instance, a row can refer to either the horizontal or the vertical dimension of a display device.

The term "cell" is used herein to refer to a circuit that forms a building block for a more complex circuit that includes multiple instances of the cell. For example, each emitter may be paired with a respective emitter cell comprising circuitry for driving the emitter.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Example embodiments relate to techniques for controlling a display comprising a plurality of light emitters, by shifting input data between light emitters. Various data shifting arrangements are described, including analog circuit implementations and digital circuit implementations. The embodiments described herein may be used in various combinations. For example, a digital data shifter can be used in combination with an analog emitter circuit or in combination with a digital emitter circuit. The combinations described herein are therefore to be taken as illustrative.

In certain embodiments, a display system includes a feedback arrangement for collecting feedback about the operational status or health of the driving circuitry, the data shifting circuitry, and/or the emitters themselves. The feedback is collected through a configurable feedback path and can include voltage and/or current measurements. In some embodiments, feedback is collected by shifting a test value through an entire column of emitter circuits in order to obtain a measurement indicative of the health of the column as a whole.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Example embodiments relate generally to techniques for shifting data in connection with operation of a display. In some embodiments, the display is a scanning display that generates an output image for a user of an HMD by scanning a display image using a scanning assembly (e.g., a rotating scanning mirror or some other reflective surface). The scanning can be in one or more directions (e.g., along display rows and/or display columns) and can cover one or more rows/columns at a time (e.g., multiple rows per color). The scanning can be used to form an output image that is larger and/or of a different resolution than the physical display. As will be explained, a scanning display can be operated by shifting the same image data down a row or column to cause the next emitter in the same row/column to produce the same light output as the previous emitter. One practical application for shifting the image data in this manner is to generate a single pixel of the output image using contributions from multiple emitters. The outputs of different emitters can be mapped onto the same spatial position in the output image using the scanning apparatus. If the scanning is performed fast enough, the user will perceive the outputs of the emitters as a single unit, e.g., through integrating the intensities of the individual emitters.

Example embodiments are described in connection with current mode displays, i.e., displays in which the emitters are driven using input currents. However, the data shifting techniques described herein can be readily adapted for voltage controlled displays.

Data Shifting in Scanning Displays

FIG. 1 shows a waveguide assembly 100 for implementing one or more embodiments. In some embodiments, the waveguide assembly 100 is a component of a near-eye display (NED), for example, an HMD. The waveguide assembly 100 includes a scanning display 110, an output waveguide 120, and a controller 130. For purposes of illustration, FIG. 1 shows the waveguide assembly 100 associated with a single eye 190, but in some embodiments, another waveguide assembly separate (or partially separate) from the waveguide assembly 100, provides image light to another eye of the user. In a partially separate system, one or more components may be shared between waveguide assemblies for each eye.

The scanning display 110 generates image light 155. The scanning display 110 includes a light source 140 and an optics system 145. The light source 140 is an optical component that generates light using a plurality of emitters placed in an array.

Figure 2:
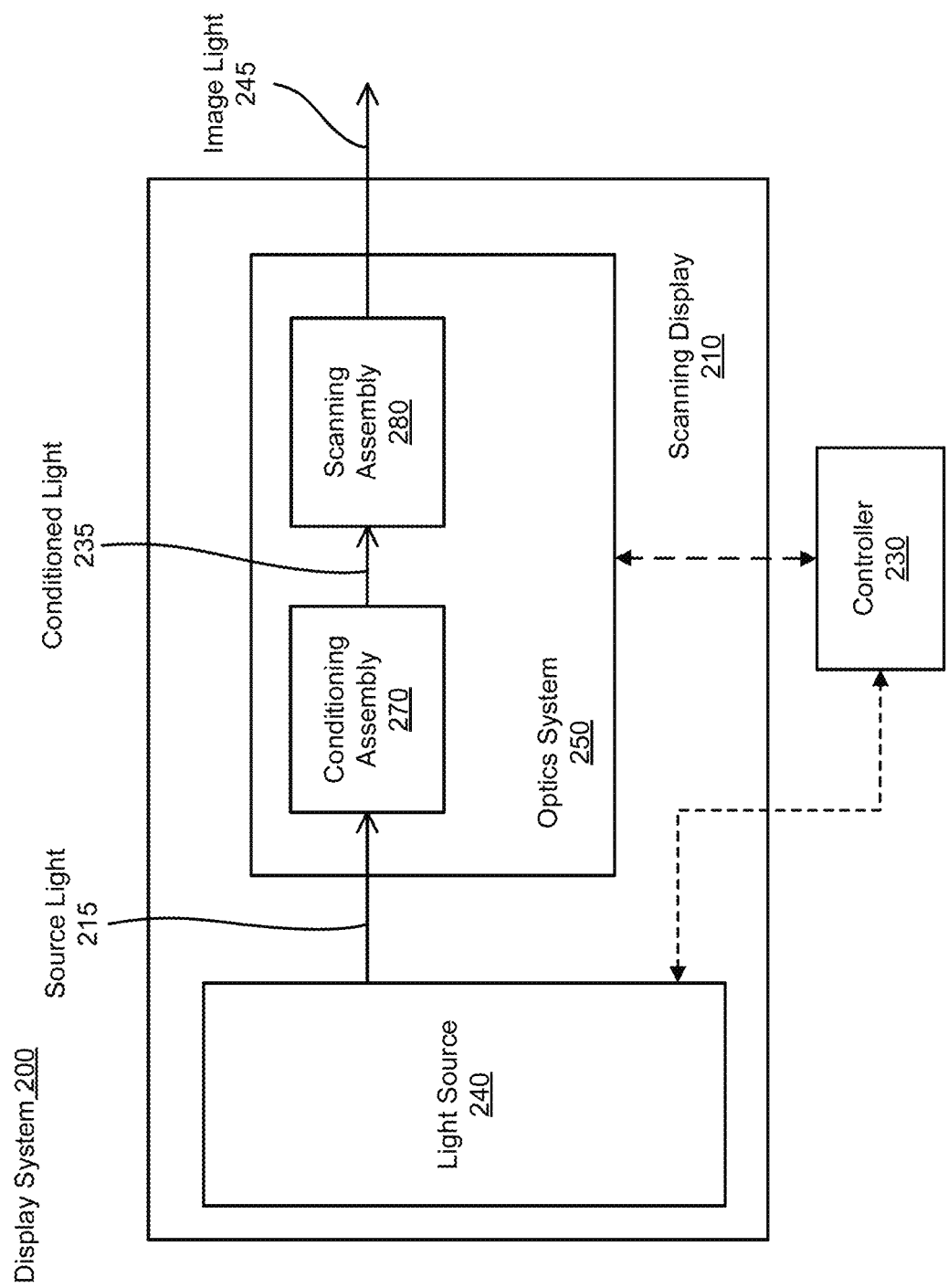
FIG. 2 is a simplified block diagram of a display system including a scanning display, for implementing one or more embodiments.
Figure 3:
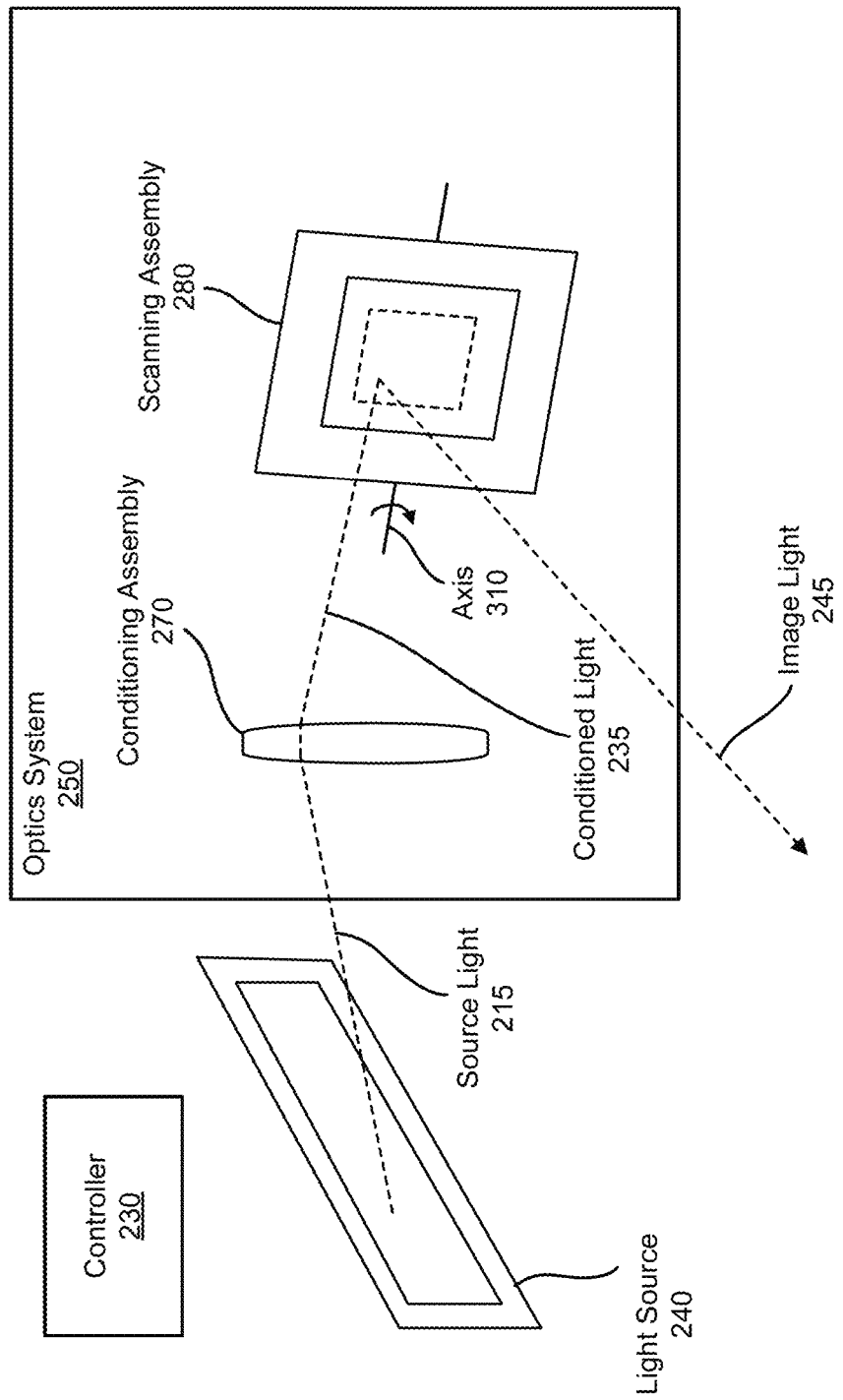
FIG. 3 shows the operation of the scanning display of FIG. 2.

The optics system 145 performs a set of optical processes, including, but not restricted to, focusing, combining, collimating, transforming, conditioning, and scanning processes on the image light generated by the light source 140. The optics system 145 may include a conditioning assembly and a scanning mirror assembly, which are shown in FIGS. 2 and 3. The scanning display 110 generates and outputs image light 155—influenced by at least one of the light source 140, the conditioning assembly, and the scanning mirror assembly—to one or more coupling elements 150 of the output waveguide 120.

The output waveguide 120 is an optical waveguide that outputs images to the eye 190 of the user. The output waveguide 120 receives the image light 155 at one or more coupling elements 150, and guides the received input image light 155 to one or more decoupling elements 160. In some embodiments, the one or more coupling elements 150 couple the image light 155 from the scanning display 110 into the output waveguide 120. The one or more coupling elements 150 may include, e.g., a diffraction grating, a holographic grating, some other element that couples the image light 155 into the output waveguide 120, or some combination thereof. For example, in embodiments where the coupling elements 150 include a diffraction grating, the pitch of the diffraction grating is chosen such that total internal reflection occurs, and the image light 155 propagates internally toward the one or more decoupling elements 160.

The one or more decoupling elements 160 decouple the total internally reflected image light from the output waveguide 120. The one or more decoupling elements 160 may include, e.g., a diffraction grating, a holographic grating, some other element that decouples image light out of the output waveguide 120, or some combination thereof. For example, in embodiments where the one or more decoupling elements 160 include a diffraction grating, the pitch of the diffraction grating is chosen to cause incident image light to exit the output waveguide 120. An orientation and position of the light exiting from the output waveguide 120 is controlled by changing an orientation and position of the image light 155 entering the one or more coupling elements 150.

The output waveguide 120 may be composed of one or more materials that facilitate total internal reflection of the image light 155. The output waveguide 120 may be composed of e.g., silicon, plastic, glass, or polymers, or some combination thereof. The output waveguide 120 has a relatively small form factor. For example, the output waveguide 120 may be approximately 50 mm wide along an x-dimension, 30 mm long along a y-dimension and 0.5 to 1 mm thick along a z-dimension.

The controller 130 controls the scanning operations of the scanning display 110. The controller 130 determines scanning instructions for the scanning display 110 based at least on the one or more display instructions. Display instructions are instructions to render one or more images. In some embodiments, display instructions may simply be an image file (e.g., bitmap). The display instructions may be received from, e.g., a console of a NED system (not shown). Scanning instructions are instructions used by the scanning display 110 to generate image light 155. The scanning instructions may include, e.g., a type of a source of image light (e.g., monochromatic, polychromatic), a scanning rate, an orientation of a scanning apparatus, one or more illumination parameters (described below with reference to FIG. 2), or some combination thereof. The controller 130 includes a combination of hardware, software, and/or firmware not shown here so as not to obscure other aspects of the disclosure.

FIG. 2 is a simplified block diagram of a display system 200 for implementing one or more embodiments. The display system 200 includes a scanning display 210, which is an embodiment of the scanning display 110 of FIG. 1, and further includes a controller 230, a light source 240, and an optics system 250. The light source 240 is an embodiment of the light source 140; the optics system 250 is an embodiment of the optics system 145; and the controller 230 is an embodiment of the controller 130.

The scanning display 210 generates image light 245 in accordance with scanning instructions from the controller 230. The scanning display 210 includes a light source 240 and an optics system 250. The light source 240 is a source of light that generates a spatially coherent or a partially spatially coherent source light 215. The optics system 250 comprises at least a conditioning assembly 270 and a scanning assembly 280. The conditioning assembly 270 conditions the source light 215 into conditioned light 235, and the scanning assembly 280 scans the conditioned light 235. The image light 245 may be coupled to an entrance of an output waveguide (e.g., one or more coupling elements 150 of the output waveguide 120 of FIG. 1).

The light source 240 emits light in accordance with one or more illumination parameters received from the controller 230. An illumination parameter is an instruction used by the light source 240 to generate light. An illumination parameter may include, e.g., source wavelength, pulse rate, pulse amplitude, beam type (continuous or pulsed), other parameter(s) that affect the emitted light, or some combination thereof. The illumination parameter can be applied to an emitter of the light source 240 using analog and/or digital signals.

The light source 240 comprises a plurality of emitters, wherein each emitter may be, e.g., a light-emitting diode (LED), a laser diode, a vertical cavity surface emitting laser (VCSEL), an organic LED (OLED), a micro-LED (uLED), a tunable laser, or some other light source that emits coherent or partially coherent light. The emitters of the light source 240 emit light in a visible band (e.g., from about 390 nm to 700 nm), and they may emit light in accordance with one or more illumination parameters. In some embodiments, the scanning display 210 comprises multiple light sources each with its own array of emitters emitting light in a distinct wavelength such that when scanned, light emitted from each of the light sources are overlapped to produce various wavelengths in a spectrum. Each emitter of the light source 240 comprises an emission surface from which a portion of source light is emitted. The emission surface may be identical for all emitters or may vary between emitters. An emitter width is a width of an area of the emission surface. The emission surface may have different shapes (e.g., circular, hexagonal, etc.). For example, an emitter which is a uLED with a circular emission surface may have an emitter width of 25 micrometers characterized as a diameter of the circular emission surface.

The plurality of emitters of the light source 240 is arranged as an array of emitters. The emitters can be organized in a one-dimensional (1D) or two-dimensional (2D) array. In a 2D array, the emitters are formed along a first dimension and a second dimension orthogonal to the first dimension (e.g., along rows and columns). Each column of emitters corresponds to a respective column in an image ultimately displayed to the user. The emitters may be of various colors. For example, the light source 240 may include a set of red emitters, a set of green emitters, and a set of blue emitters, where emitters of different color together form an individual pixel. For example, an individual pixel may include at least one red emitter, at least one green emitter, and at least one blue emitter. Rows of emitters of the same color may be arranged in a single group. For example, the array may comprise N rows of red emitters followed by N rows of green emitters and then N rows of blue emitters.

The light source 240 may include additional components (e.g., driving circuits, memory elements, heat sinks, etc.). In one or more embodiments, the light source 240 comprises a plurality of data shifting circuits and a plurality of driving circuits, which are electrically coupled to the array of emitters. The driving circuits include circuitry for controlling the array of emitters. The driver circuits apply illumination parameters received from the controller 230 (e.g., data values received from a display driver of the controller) to electrically control each emitter in the array of emitters using analog and/or digital control signals.

Figure 11:
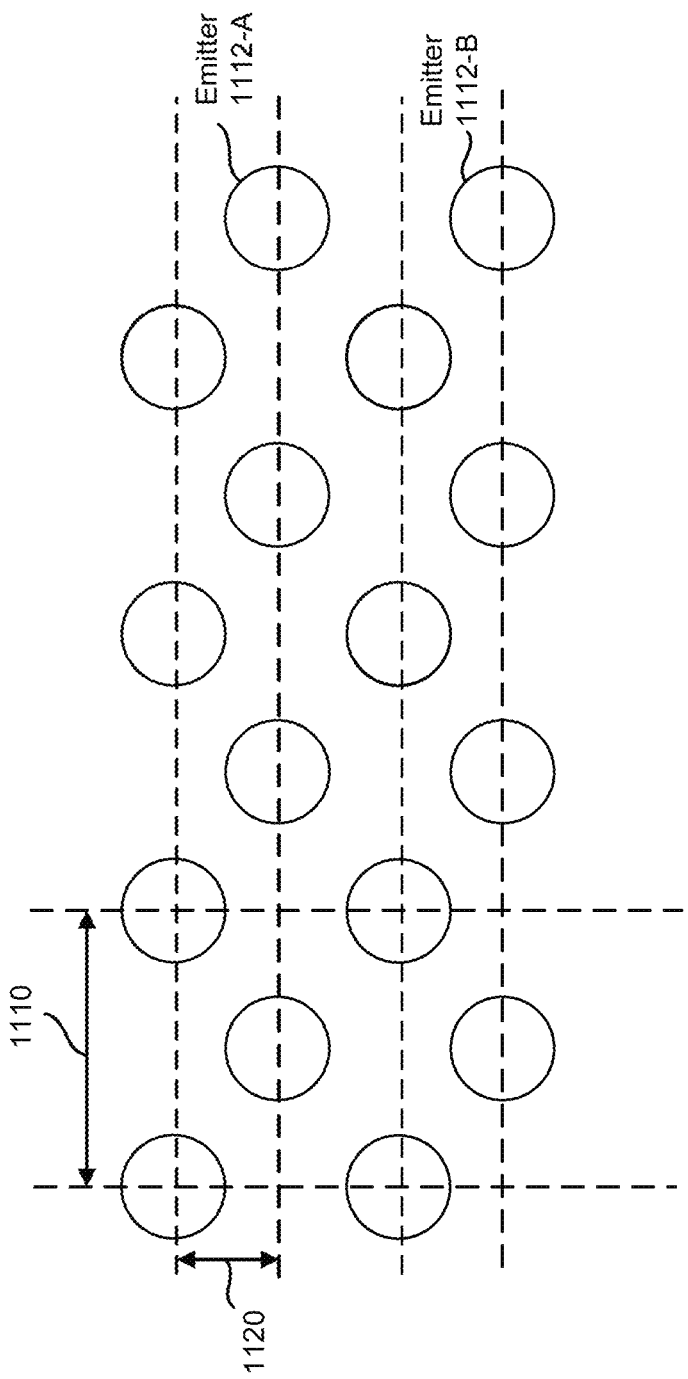
FIG. 11 shows an emitter layout with phantom emitters, for implementing one or more embodiments.

The light source 240 may further include phantom emitters, which are physical or imaginary emitters that are located between emitters that are actually used for generating light output. An example emitter layout including imaginary phantom emitters is shown in FIG. 11. Example embodiments of data shifting circuits for shifting data between actual emitters and phantom emitters, as well as between actual emitters, are described below.

The conditioning assembly 270 conditions source light 215 from the light source 240. Conditioning the source light 215 may include, e.g., expanding, collimating, focusing, distorting emitter spacing, adjusting orientation an apparent location of an emitter, correcting for one or more optical errors (e.g., field curvature, chromatic aberration), some other adjustment of the light, or some combination thereof. The conditioning assembly 270 comprises one or more optical elements (e.g., lenses, mirrors, apertures, gratings, or any other suitable optical element that affects image light).

The scanning assembly 280 includes one or more optical elements that redirect light via one or more reflective portions of the scanning assembly 280. The direction where the light is redirected toward depends on specific orientations of the one or more reflective portions. The one or more reflective portions of the scanning assembly may form a planar or curved surface (e.g., spherical, parabolic, concave, convex, cylindrical, etc.) that operates as a mirror. The scanning assembly 280 scans along at least one dimension of a 2D emitter array. In some embodiments, the scanning assembly 280 is configured to scan in at least the smaller of the two dimensions. For example, if the emitters are arranged in a 2D array where the rows are substantially longer (i.e., contain more emitters) than the columns, then the scanning assembly 280 may scan down the columns (e.g., row by row or multiple rows at a time). In other embodiments, the scanning assembly 280 may perform a raster scan (horizontally or vertically depending on scanning direction). The scanning assembly 280 can include multiple scanning mirrors, each of which is configured to scan in 0, 1, or 2 dimensions.

The controller 230 controls the light source 240 and the optics system 250. The controller 230 takes content for display and divides the content into discrete sections. The controller 230 instructs the light source 240 to sequentially present the discrete sections using individual emitters corresponding to a respective column in an image ultimately displayed to the user. The controller 230 instructs one or both of the conditioning assembly 270 and the scanning assembly 280 to condition and/or scan the presented discrete sections. The controller 230 controls the optics system 250 to direct the discrete sections of the image light 245 to different areas, e.g., different portions of one or more coupling elements 150 of the output waveguide 120. Accordingly, at the eye box of the output waveguide, each discrete portion is presented in a different location. While each discrete section is presented at different times, the presentation and scanning of the discrete sections occurs fast enough such that a user's eye integrates the different sections into a single image or series of images. The controller 230 also provides illumination parameters (e.g., intensity or brightness values) for the light source 240. The controller 230 may control each individual emitter of the light source 240.

FIG. 3 shows the operation of the scanning display 210 of FIG. 2. The scanning display 210 generates light in accordance with scanning instructions from the controller 230. The light source 240 of the scanning display 210 generates the spatially coherent or the partially spatially coherent source light 215. The optics system 250 receives the source light 215 and with the conditioning assembly 270 converts the source light 215 into conditioned light 235. The conditioned light 235 is then scanned by the scanning mirror assembly 280. The scanning assembly 280 may perform the scanning by rotating about one or more axes (e.g., an axis 310), thereby emitting the image light 245 in one or more dimensions.

FIGS. 4A to 4E illustrate shifting of image data 400 from a scanning display onto a user's eye, in accordance with an embodiment. The image data 400 is depicted using alphabetical labels "A" to "M", with each letter representing a row of image data. Each piece of image data 400 is transmitted over time to N number of emitters 412. The emitters 412 may belong to different rows of the same column. Alternatively, the emitters 412 may belong to different columns of the same row. The shifting process depicted in FIGS. 4A to 4E can be used to simultaneously drive multiple rows/columns at a time. For example, in one embodiment the scanning display has 2,560×1,536 emitters with 3 colors (e.g., red, green, and blue) and N=8 rows per color. One way to operate the emitters is to send image data for all N emitters every time the row/column is activated. For example, the image data A, C, and E could be sent to emitters 412-C, 412-B, and 412-A, respectively, followed by image data B, D, and E during the next row time. The process of FIGS. 4A to 4E shows an alternative method that reduces the amount of data that needs to be sent.

Figure 4A:
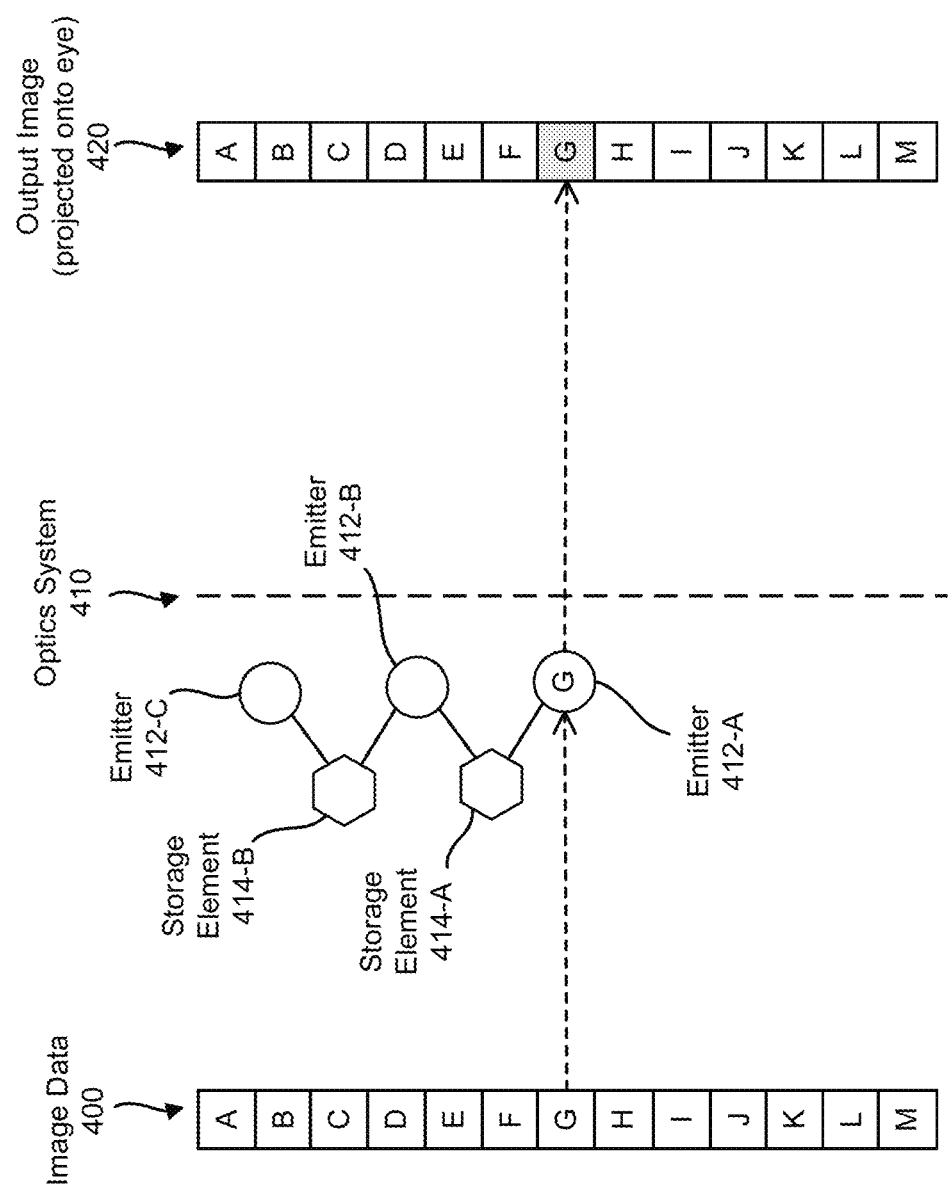
FIGS. 4A to 4E illustrate shifting of image data from a scanning display onto a user's eye, in accordance with an embodiment.

FIG. 4A shows image data G being loaded into the emitter 412-A and scanned by an optics system 410 to emit light onto an output image 420. The output image 420 corresponds to an image projected onto an eye of a user. As shown, the value G is represented in the output image 420 at a spatial location corresponding to the location of the value G in the image data 400. For convenience, these locations will be referred to as pixels even though, as explained earlier, a pixel may include multiple emitters of different colors rather than a single emitter. Each pixel in the output image 420 may be illuminated N times for each color over a scan cycle. For example, the image data G may be output N times, each time using a different one of the emitters 412. To avoid retransmitting the image data each time, the image data can be stored using storage elements 414 and shifted into the next emitter that is to receive the same image data.

Figure 4B:
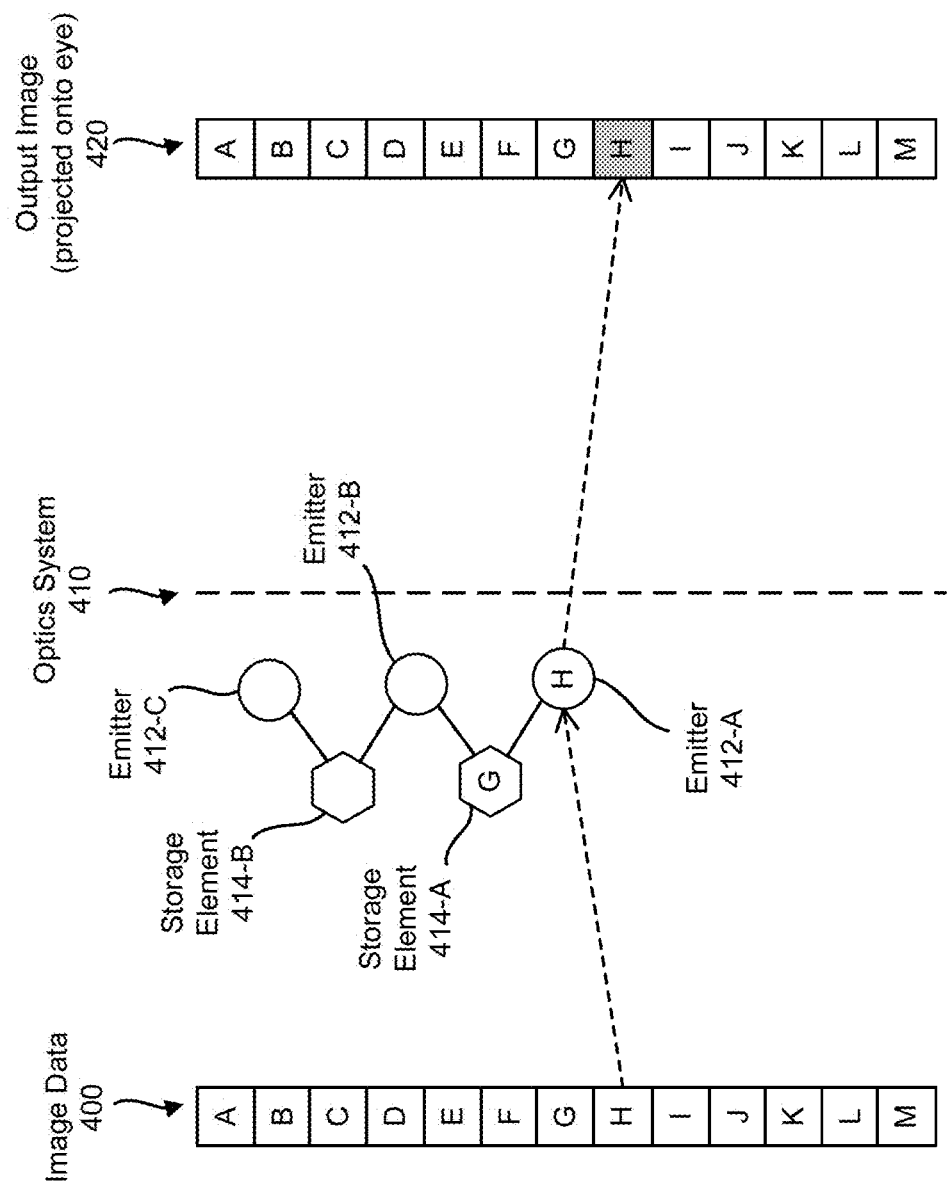

FIG. 4B shows the image data G transferred to storage element 414-A and loading of new image data H into the emitter 412-A. The image data H is projected onto a corresponding pixel in the output image 420.

Figure 4C:
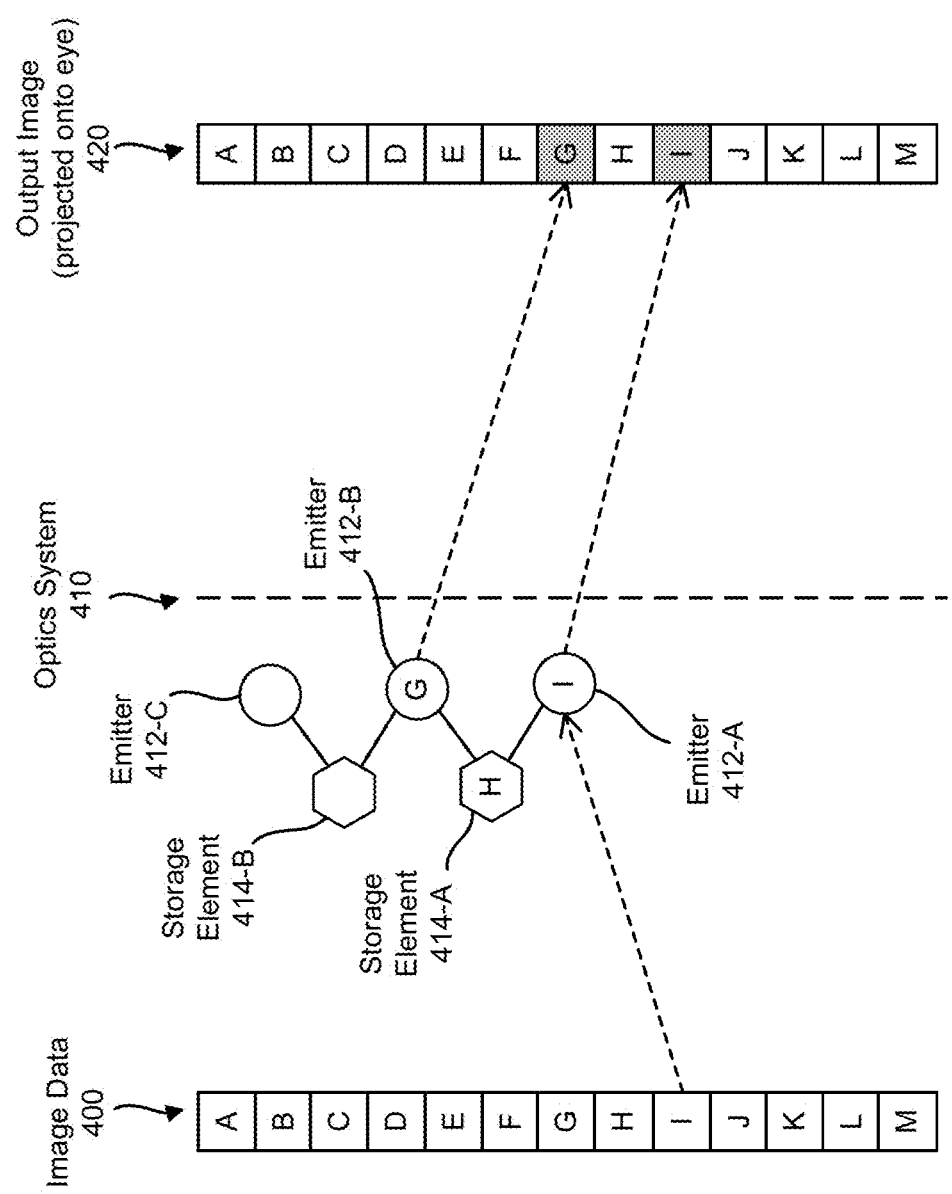

FIG. 4C shows the image data G loaded into emitter 412-B from the storage element 414-A. The image data H is loaded into the storage element 414-A in preparation for loading into the emitter 412-B during the next row time. Additionally, new image data I is loaded into emitter 412-A, with the image data G and I being projected onto the output image 420.

Figure 4D:
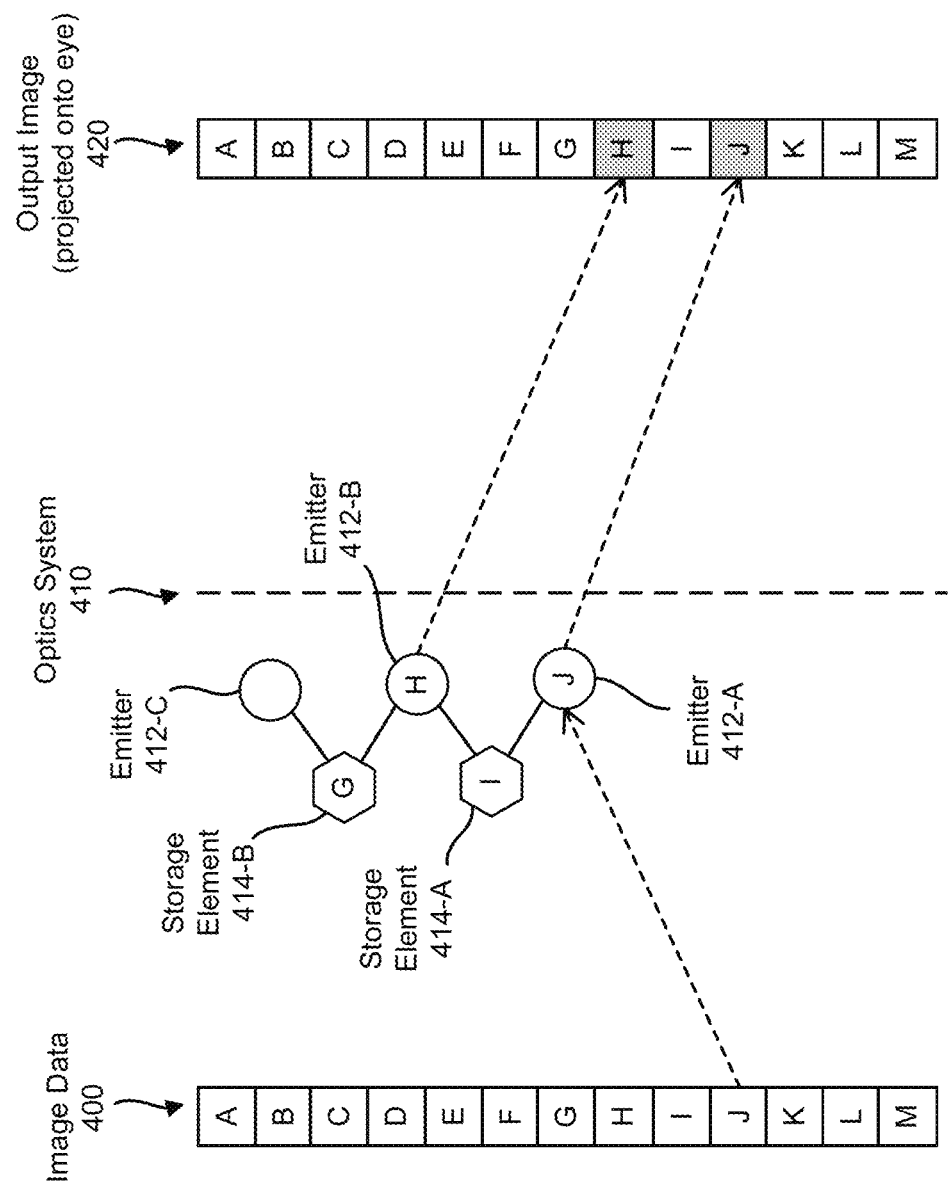

FIG. 4D shows the image data H loaded into emitter 412-B from the storage element 414-A. The image data I is loaded into the storage element 414-A in preparation for loading into the emitter 412-B during the next row time. Similarly, the image data G is loaded into the storage element 414-B in preparation for loading into the emitter 412-C during the next row time. Additionally, new image data J is loaded into emitter 412-A, with the image data H and J being projected onto the output image 420.

Figure 4E:
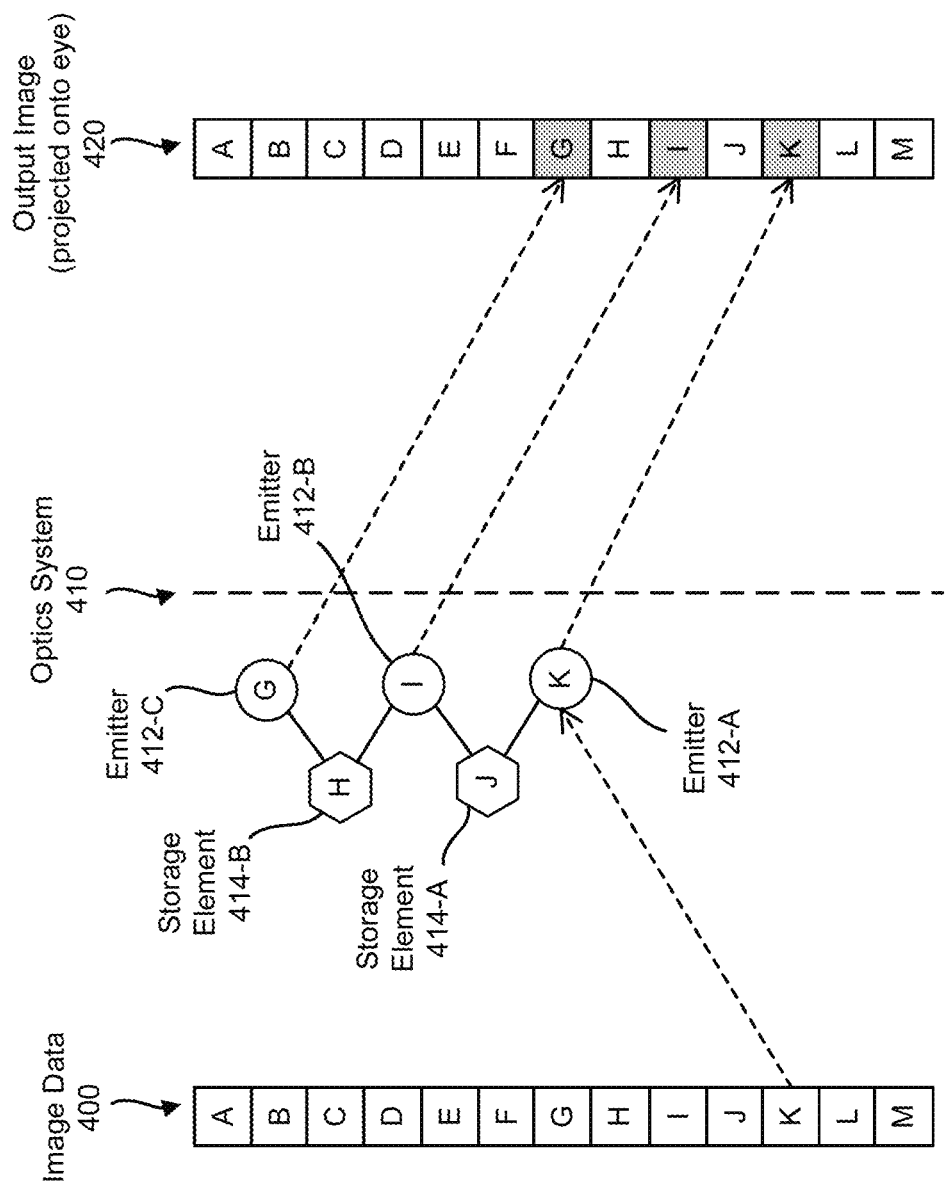

FIG. 4E shows the image data G loaded into emitter 412-C from the storage element 414-B and the image data I loaded into emitter 412-B from the storage element 414-A. The image data H and the image data J are loaded into the storage elements 414-B and 412-A, respectively. Additionally, new image data K is loaded into emitter 412-A, with the image data G, I, and K being projected onto the output image 420. Thus, FIGS. 4A to 4E illustrate the sequential loading of new image data into a first emitter (i.e., emitter 412-A), with the image data being shifted into other emitters (i.e., emitters 412-B and 412-C) using the storage elements 414, until the end of the row or column is reached. It can be seen that if the process were to continue, each item of image data would be projected onto the output image 420 a total of N times, once for each emitter 412, each time corresponding to a different rotational position of a scanning assembly. Each pixel of the output image 420 would then be perceived as an aggregate of N number of brightness units. The example of FIGS. 4A to 4E also illustrates the use of storage elements to implement phantom cells for temporary storage of image data with a one cycle delay in output to the next emitter. However, as will be explained, it is also possible to configure storage elements so that the image data is immediately shifted into the next emitter for the next row time.

Example Display Systems

Figure 5:
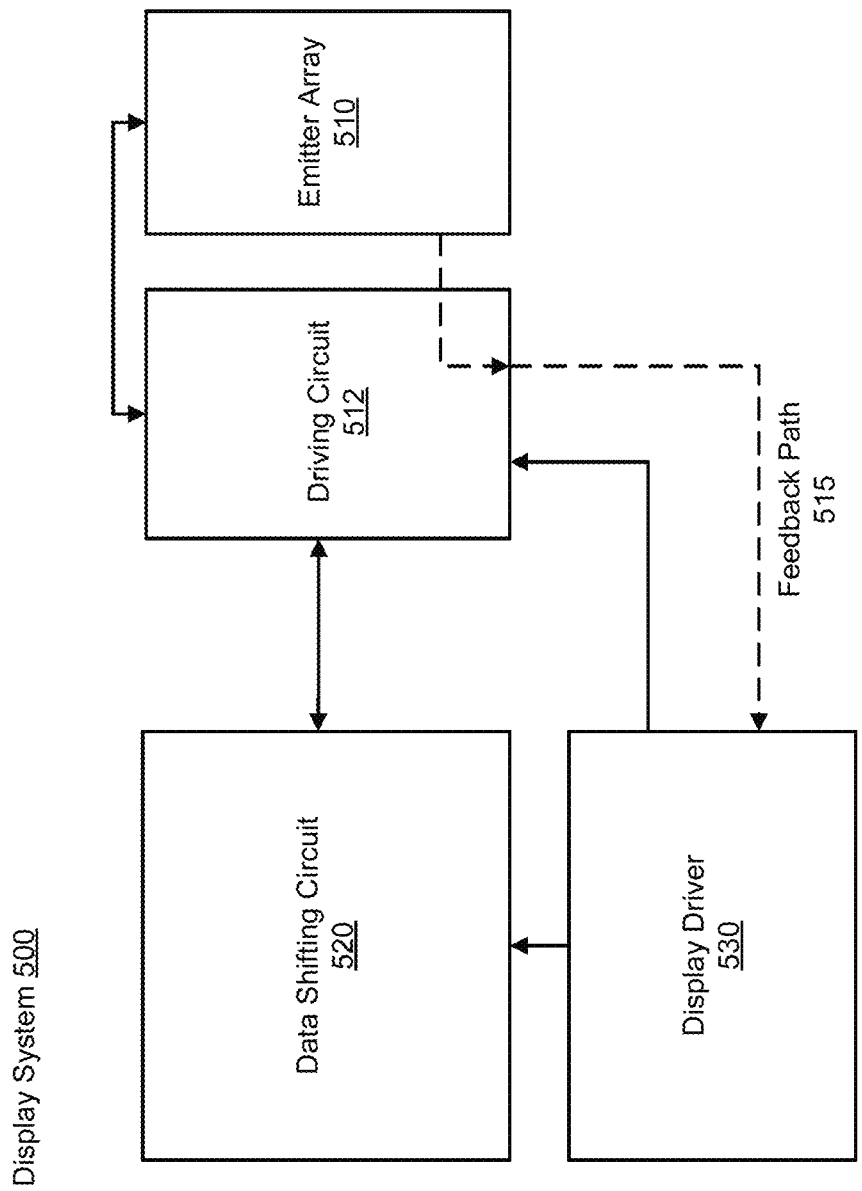
FIG. 5 is a high level block diagram of a display system, in accordance with an embodiment.

FIG. 5 is a high level block diagram of a display system 500, in accordance with an embodiment. The display system 500 includes an emitter array 510 of light emitters (e.g., uLEDs). The emitter array 510 can be a 1D array (e.g., with 1×N emitters per color) or a 2D array (e.g., with N×M emitters per color). The display system 500 further includes a driving circuit 512, a data shifting circuit 520, and a display driver 530 communicatively coupled to the driving circuit 512 and the data shifting circuit 520.

The driving circuit 512 comprises a set of electrical components operable to generate inputs to the emitter array 510 under the control of the display driver 530. For example, the driving circuit 512 may include voltage and/or current generators that supply control signals which determine the light output of the emitter array. The driving circuit 512 may include an individual circuit for each emitter of the emitter array 510. In some embodiments, the driving circuit 512 is organized as an active matrix of electronics, with the layout of the matrix mirroring that of the emitter array. The driving circuit 512 can be located in proximity to the emitter array 510 and can be connected to the emitter array though one or more communication buses that include, for example, row and/or column selection lines and lines for supplying input data to the emitter array. Example building blocks of driving circuits are described below and are referred to herein as emitter cells. The emitter cells are shown in the figures as including emitters (depicted as light emitting diodes), in order to better explain the interactions between the driving circuit and the emitters. It will, however, be understood that the emitter can be remotely located from the rest of the emitter cell.

The data shifting circuit includes a plurality of storage elements (e.g., the storage elements 414 of FIGS. 4A to 4E) for storing and shifting data into emitters in the emitter array 510. Like the driving circuit 512, the data shifting circuit 520 can be physically separate from the emitter array 510 and can be coupled to the emitter array 510 using one or more communication buses. In some embodiments, the data shifting circuit 520 is integrated into the driving circuit 512 or the display driver 530. For example, the driving circuit 512 can be formed using emitter cells that include built-in data shifting elements.

The display driver 530 is configured to control the driving circuit 512 to supply image data to the emitters using analog and/or digital control signals. The display driver 530 is also configured to control the operation of the data shifting circuit 520, in particular the timing with which image data is loaded into and shifted out of storage elements. The display driver 530 can generate image data in synchronization with scanning of the emitters. For example, the display driver 530 may control the timing with which data is input to the first emitter in a column, as well as the timing of when data is shifted to the remaining emitters in the column, where the timings are relative to the instantaneous position of a scanning mirror controlled by the display driver 530. In particular, the display driver 530 can control the timings such that the light outputs from different emitters in the same column are combined into a single pixel of an output image.

Figure 20:
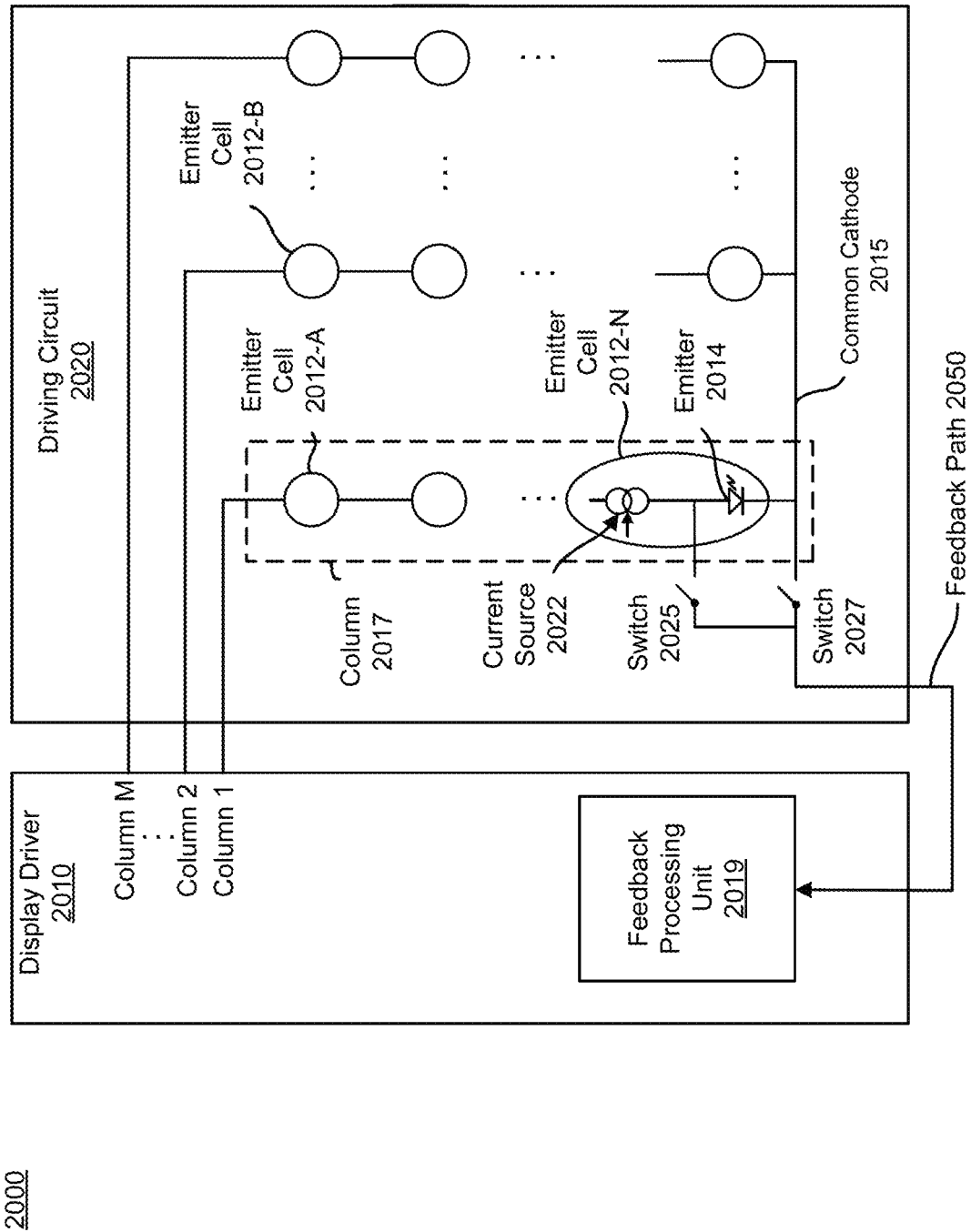
FIG. 20 is a simplified block diagram of a display system with feedback collection capabilities, in accordance with an embodiment.

In some embodiments, the display driver 530 is communicatively coupled to the emitter array through a feedback path 515 that connects to the driving circuit 512. The feedback path 515 provides for transmission of signals indicative of the operational status or health of the emitter array. The display driver 530 can process this feedback information to adjust the operation of the emitter array 510, e.g., to compensate for a defective emitter by increasing the outputs of other emitters to make up for the missing contribution of the defective emitter. An example display system with feedback capabilities is shown in FIG. 20.

Figure 6:
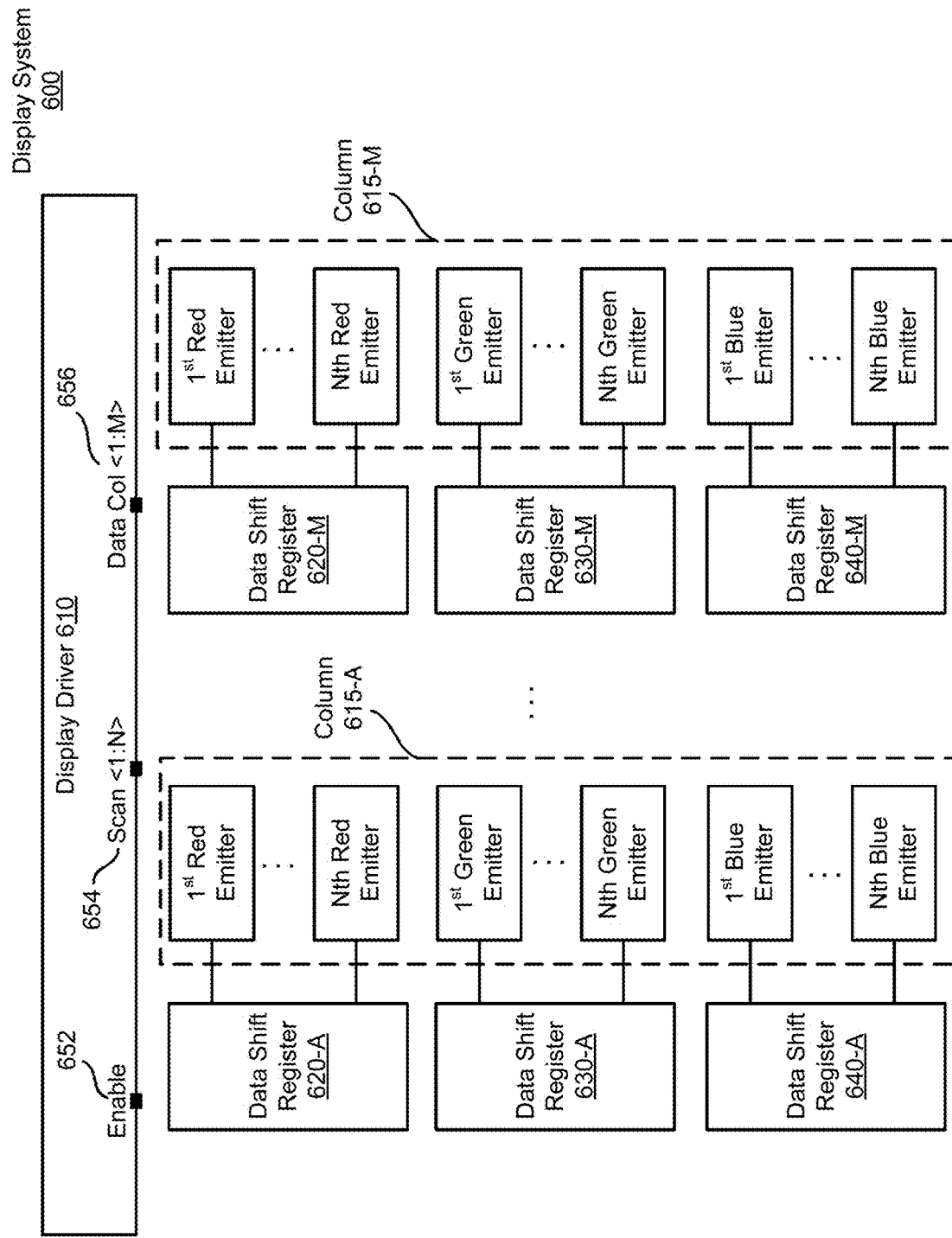
FIG. 6 is a simplified block diagram of a display system including data shifting elements, in accordance with an embodiment.

FIG. 6 is a simplified block diagram of a display system 600 including data shifting elements, in accordance with an embodiment. The display system 600 includes a display driver 610 and a plurality of emitter columns 615. Each column of a particular color is coupled to a respective data shift register. For example, the first column of red emitters is coupled to a data shift register 620-A and the Mth column of red emitters is coupled to a data shift register 620-M. Similarly, data shifters 630 and 640 are provided for the green and blue emitters, respectively. The display driver 610 is configured to generate an enable signal 652, a plurality of scan signals 654, and a plurality of data signals 656. Each of the data shift registers 620, 630, and 640 may be coupled to the outputs of the display driver 610. The enable signal 652 is a global signal that enables the columns to be activated. The scan signals 654 are sequentially asserted to sequentially scan through N rows worth of image data per color. The data signals 656 provide image data to the columns, one row at a time.

As explained in connection with FIGS. 4A to 4E, instead of programming the emitters row by row, data throughout can be increased by programming only one row (for each color) at each row time since the data can be reused by other emitters in the same column. Thus, for example, the data shift registers 620 can shift image data from the first red emitter to the Nth red emitter of a particular column. Similarly, the data shift registers 630 and 640 can shift data from the first to the Nth blue or green emitter of a particular column.

Figure 7:
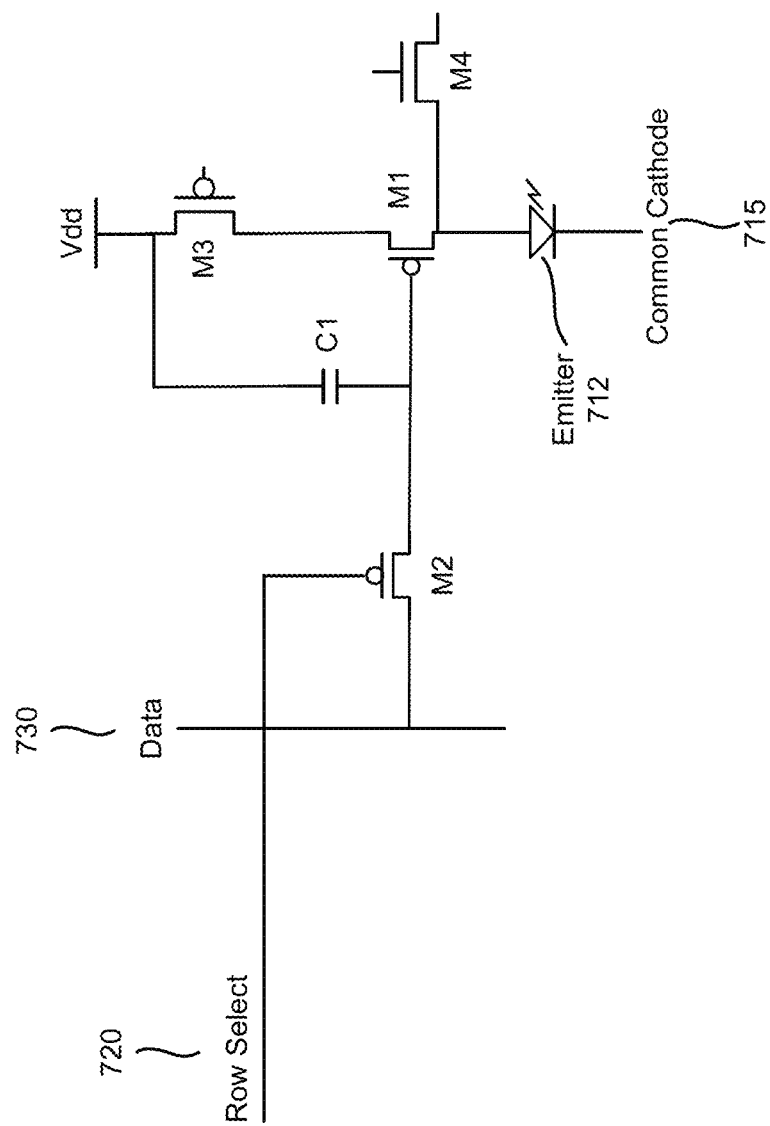
FIG. 7 is a circuit diagram of an analog emitter cell, in accordance with an embodiment.

FIG. 7 is a circuit diagram of a programmable analog emitter cell 700, in accordance with an embodiment. The emitter cell 700 includes an emitter 712 connected between a transistor M1 and a common cathode 715. The common cathode 715 may be shared by emitters of the same color, including emitters in different columns, and can be set to a particular voltage level depending on the color. While a simple ground node is generally sufficient for purposes of driving the emitter 712, having a controllable common cathode is useful for facilitating programming of the emitter cell using shifted data. The emitter cell 700 also includes transistors M2, M3, and M4, and a storage capacitor C1. M1, M2, and M3 can be p-channel metal-oxide-semiconductor field effect transistors (p-type MOSFETs or PMOS). M4 can be an n-type MOSFET or NMOS.

Figure 9:
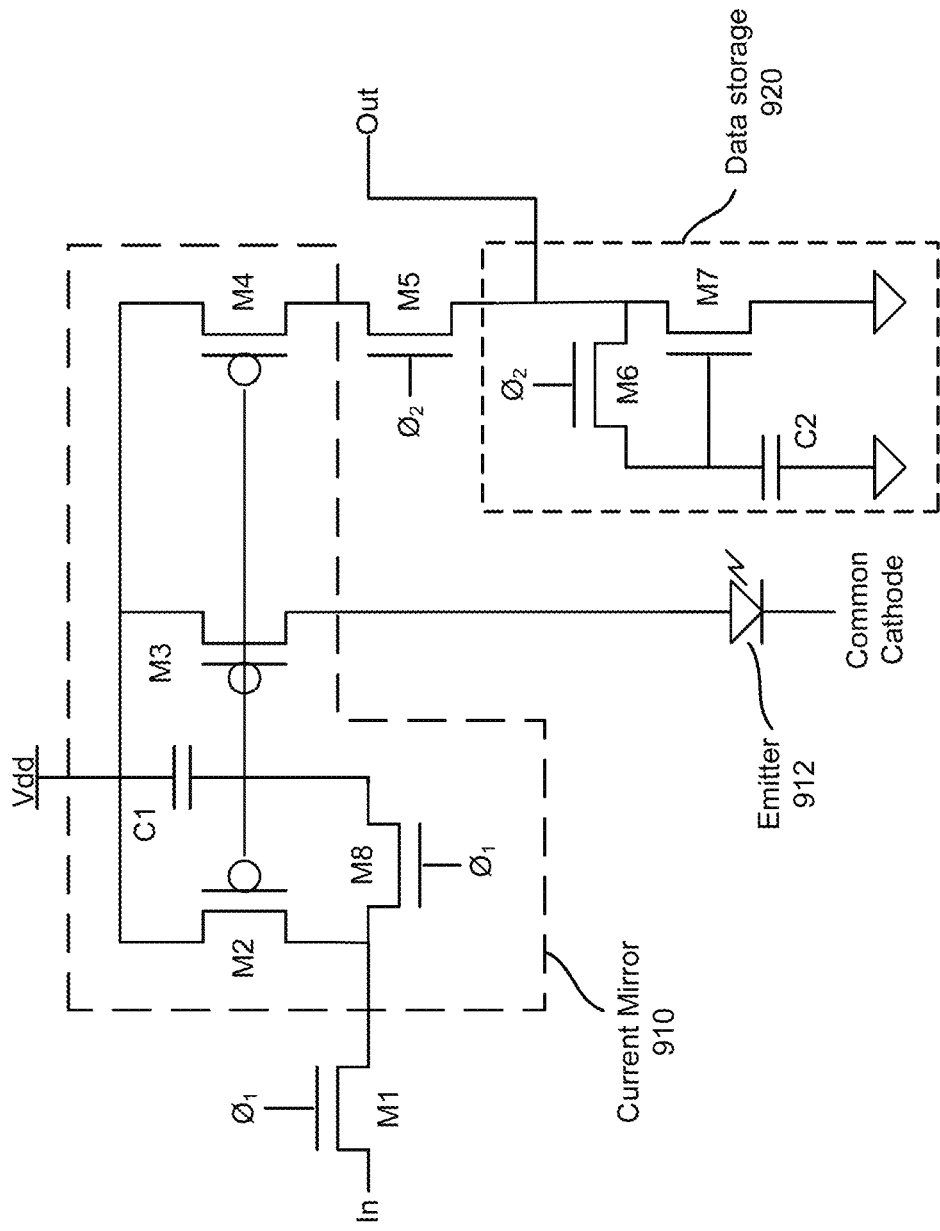
FIG. 9 is a circuit diagram of an analog emitter cell including a data shifting component, in accordance with an embodiment.

The emitter cell 700 can be programmed by asserting a signal "Row Select" 720 (e.g., one of the scan signals 654 in FIG. 6), which is connected to the gate of M2. Asserting the signal 720 causes a data signal 730 (e.g., one of the data signals 656) to be passed through M2 and stored as a charge onto capacitor C1, i.e., C1 is charged to a voltage representative of the data signal 730. The capacitor C1 is connected between a supply voltage Vdd and the gate of M1. The voltage of capacitor C1 can then be used to drive M1 while activating the transistor M3 so that a current path is established from Vdd to M1, producing a current through M1 (and thus emitter 712) that is proportional to the voltage of C1. The current through M1 can be output to another circuit via M4. A variation of the emitter cell 700 that supports data shifting is shown in FIG. 9.

Figure 8:
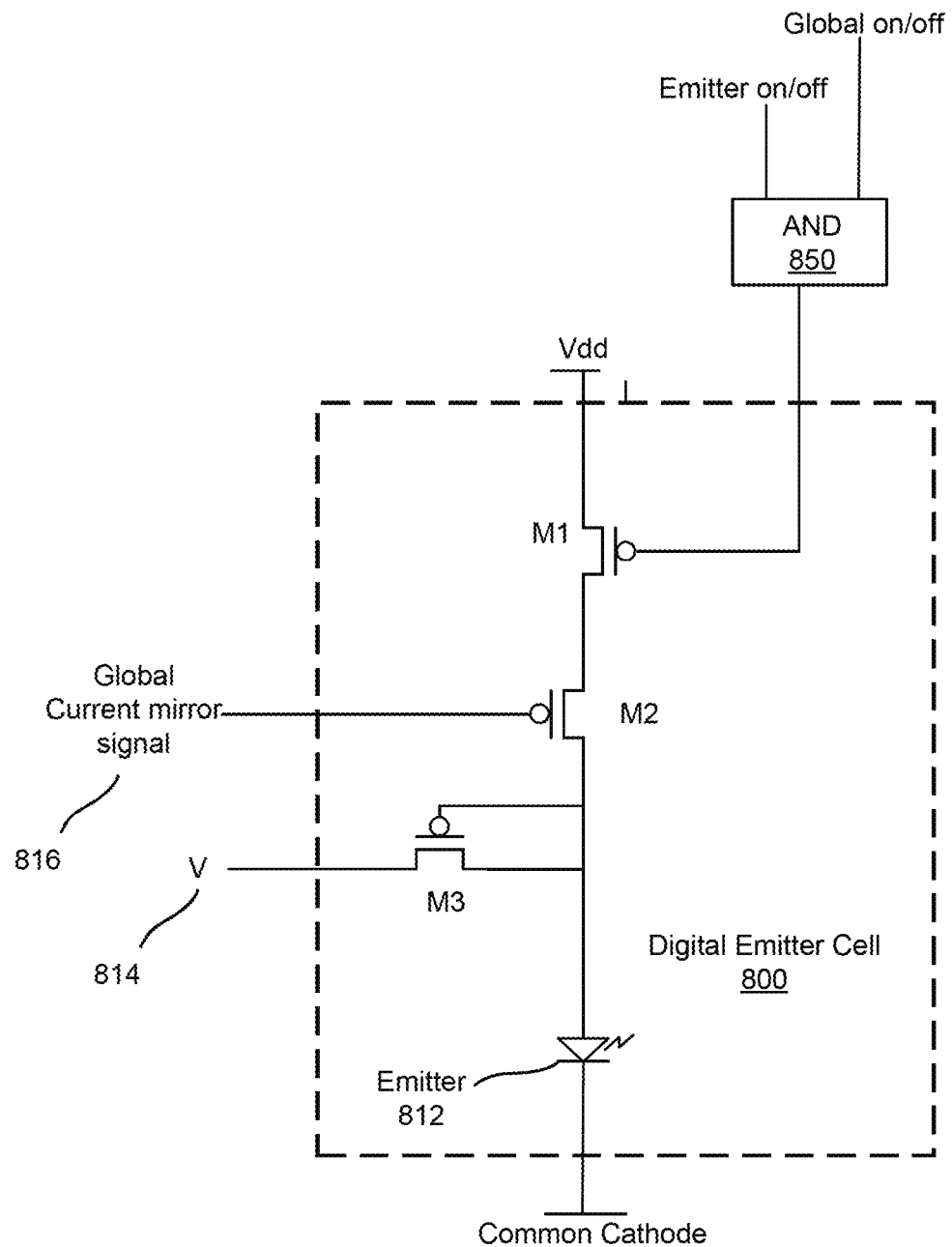
FIG. 8 is a circuit diagram of a digital emitter cell, in accordance with an embodiment.
Figure 15:
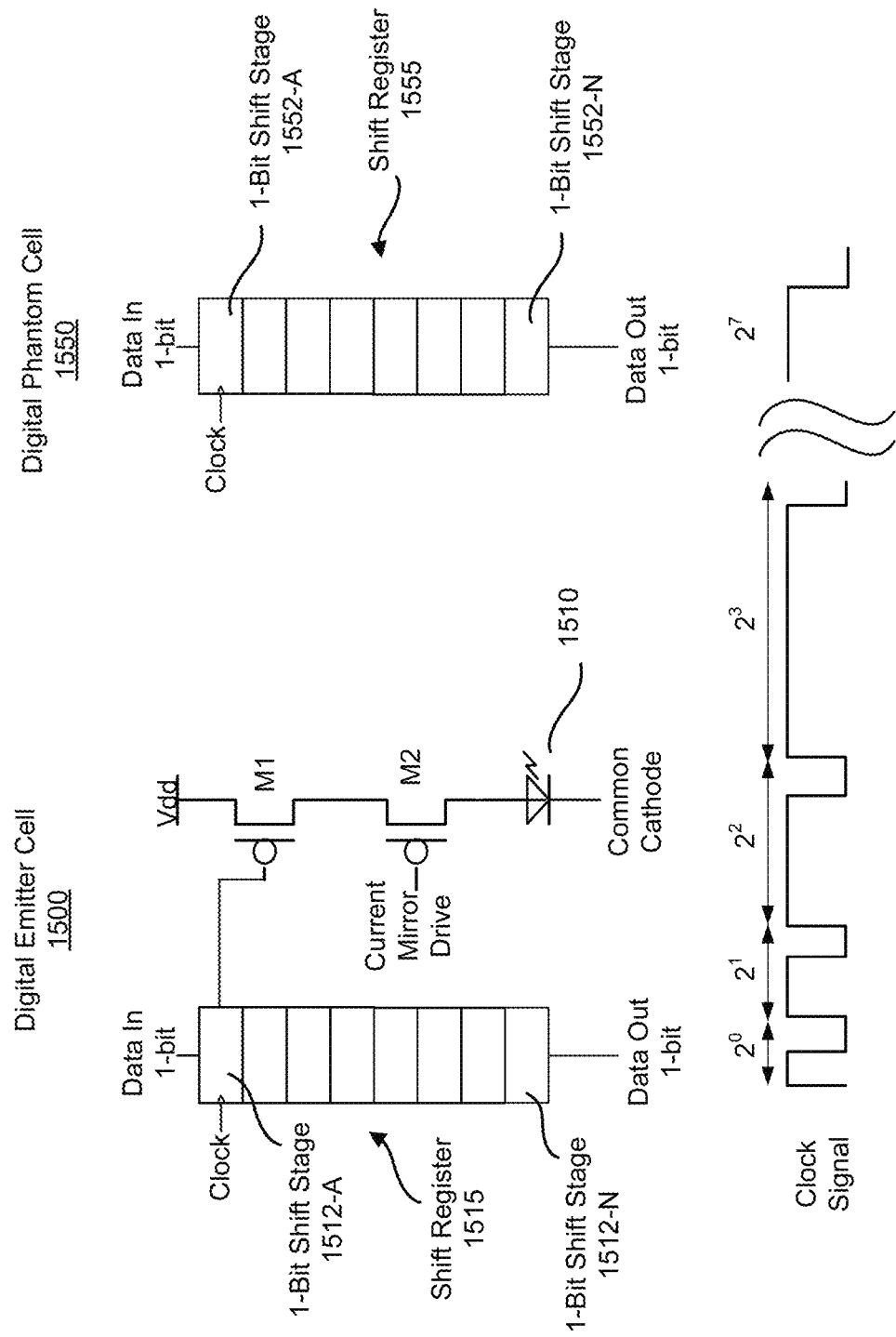
FIG. 15 shows a digital emitter cell and a digital phantom cell with data shifting components, in accordance with an embodiment.

FIG. 8 is a circuit diagram of a digital emitter cell 800, in accordance with an embodiment. The emitter cell 800 includes three PMOS transistors M1, M2, and M3 and an emitter 812. The anode side of the emitter 812 is connected to the transistors M2 and M3. The emitter 812 is also connected to a common cathode. M1 is connected between a supply voltage Vdd (e.g., +1V) and M2. The gate of M1 is controlled by an output of an AND logic gate 850, the inputs of which are a global on/off signal and an emitter on/off signal. The gate of M2 is connected to a global current mirror signal 816, which can be used to generate the same drive current in M2 of multiple emitter cells 800 simultaneously. Thus, M1 functions as an on/off switch and M2 sets the drive current. M3 is in a diode-connected configuration and receives a bias voltage 814 (e.g., −1V). M3 operates to short the emitter 812 to ensure that the emitter is fully deactivated (turned off) during times when the emitter is not supposed to emit light. A variation of the emitter cell 800 that supports data shifting is shown in FIG. 15.

Example data shifting circuits for shifting data between emitter cells will now be described. The various data shifting circuits described herein can be used to sequentially shift data into and out of emitter cells, e.g., to implement the shifting process described earlier with respect to FIGS. 4A to 4E.

Analog Data Shifting

FIG. 9 is a circuit diagram of an analog emitter cell 900 including a data shifting component, in accordance with an embodiment. The emitter cell 900 can be operated in two alternating phases using timing signals $\varnothing_1$ and $\varnothing_2$ and includes a current mirror block 910 and a data storage block 920. The emitter cell 900 includes eight transistors M1 to M8, two storage capacitors C1 and C2, and an emitter 912 (as mentioned earlier, the emitter can be located outside of the emitter cell). M1, M5, M6, M7, and M8 are NMOS. M2, M3, and M4 are PMOS and, since their source nodes are tied to Vdd (a substantially constant voltage), the currents through these M2, M3, and M4 depend only on their gate voltages as long as M2, M3, and M4 are operated in the saturation region. During phase 1, $\varnothing_1$ turns on M1 and M8 to cause an input current "In" to be stored as a voltage onto capacitor C1. The voltage stored on C1 is a voltage sufficient for reproducing the input current when applied as gate voltage onto M3. M2 is also on during this time period to establish a current path to Vdd. During phase 1, the common cathode can be set high in order to ensure that the emitter 912 is reverse biased, thereby preventing current from flowing through the emitter 912. Reverse biasing the emitter improves performance, especially contrast ratio because darker "black" levels are achieved through preventing leakage current effects. Reverse biasing also isolates the emitter from flicker noise during programming. Without reverse biasing, the voltage stored on C1 could change over time during this programming phase, creating flicker noise if the current through M3 and emitter 912 isn't constant.

Figure 10:
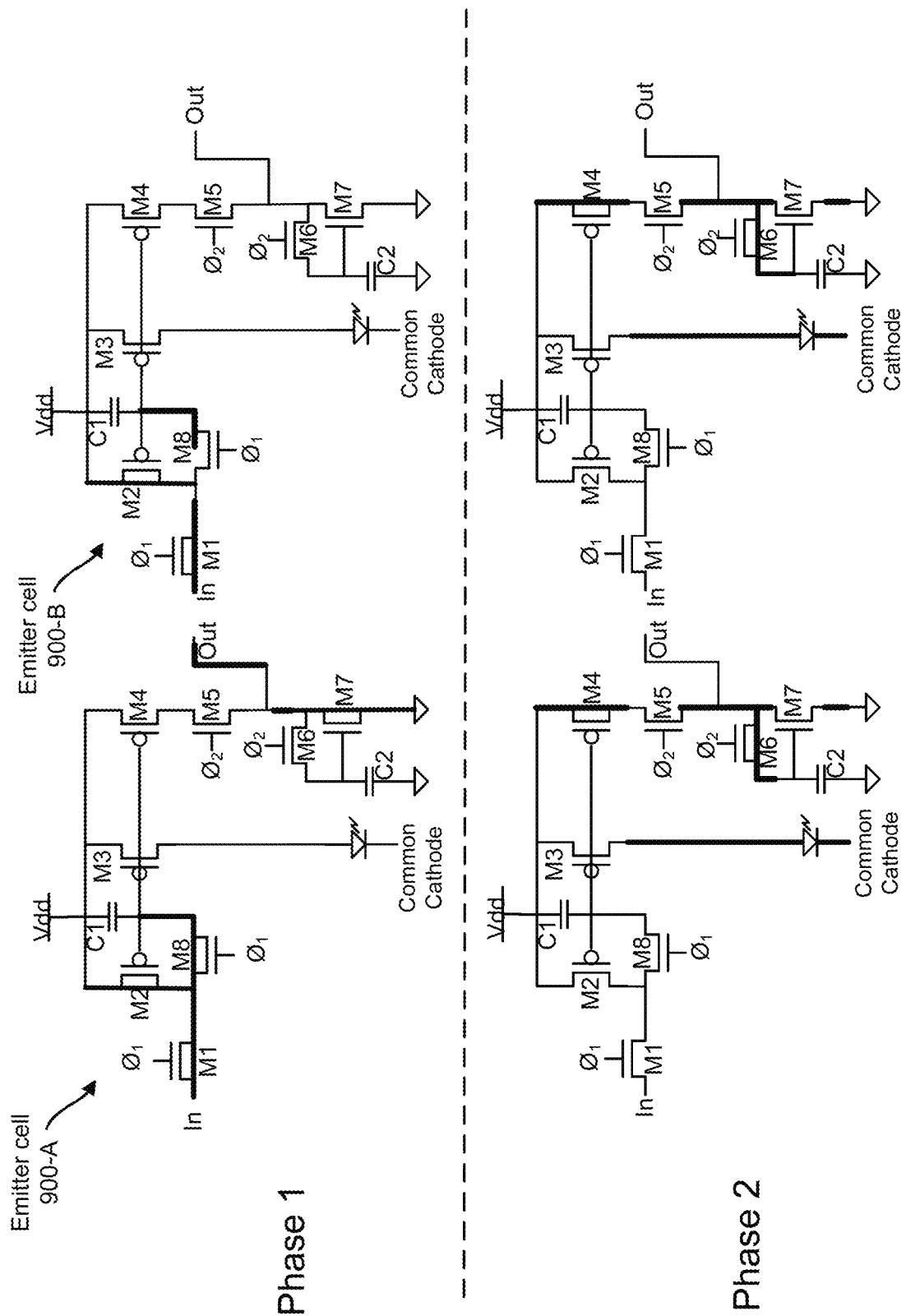
FIG. 10 shows shifting of data between two analog emitter cells, in accordance with an embodiment.

During phase 2, M1 and M8 are off and the voltage that was stored on C1 during phase 1 generates a drive current through M3 to activate the emitter 912. During phase 2, the common cathode can be set low in order to forward bias the emitter 912 (e.g., by grounding the common cathode) and allow the drive current to flow through the emitter 912. Further, the drive current is mirrored into M4 since the gates of M2, M3, and M4 are connected. The mirrored current is also passed through M5 and M6, which are turned on by $\varnothing_2$, to be stored as a voltage onto capacitor C2. M7 is also on during this time to establish a current path to the common cathode. M7 is placed into a diode-connected configuration since M6 is turned on. Thus, C2 is charged up to the voltage need to produce the current flowing through M5. As shown in FIG. 10, the node connecting M5, M6, and M7 can be connected to the input node of another instance of the emitter cell 900 to enable the voltage stored on C2 to be shifted into the other emitter cell during the next phase 1.

The transistors M2, M3, M4 can be sized for 1-to-1 current mirroring. Alternatively, to reduce the power consumption caused when a path from Vdd to the common cathode is established during programming, M3 can be made larger than M2 and M4. For example, C1 can be programmed with 1/10 the current if M3 is ten times larger in width compared to M2 and M4.

FIG. 10 shows shifting of data between two instances of the emitter cell 900. The top half of the figure shows the current paths formed during phase 1. The bottom half shows the current paths formed during phase 2. The current paths are depicted in bold lines. In phase 1, current paths are formed through M1, M2, and M8 of emitter cell 900-A. As explained earlier, this causes a voltage to be stored on C1. Additionally, the same storage process occurs simultaneously in emitter cell 900-B, with the data input to M1 of emitter cell 900-B being supplied by a current generated according to a voltage previously stored on C2 of emitter cell 900-A. M7 of the emitter cell 900-A is turned on and acts as a current sink, with the voltage stored on C2 forming the gate voltage of M7. Thus, the output current of emitter cell 900-A (and the input current of emitter cell 900-B) is the same as the current that was previously used to program C2 of emitter cell 900-A. In this manner, data that was previously used to drive emitter cell 900-A is shifted into emitter cell 900-B.

In phase 2, the emitter of emitter cell 900-A is activated according to the voltage previously stored on C1 of emitter cell 900-A during phase 1, using a drive current through M3. The emitter will be activated provided that there is a current path through the common cathode (e.g., if the common cathode is grounded and not left floating). Additionally, the voltage of C1 is transferred into C2 of emitter cell 900-A through mirroring of the drive current into M4 and M5 of emitter cell 900-A. The same process occurs simultaneously in emitter cell 900-B, with the emitter of emitter cell 900-B being driven according to the voltage stored on C1 of emitter cell 900-B (i.e., the voltage that was transferred from C2 of emitter cell 900-A during phase 1).

FIG. 11 shows an emitter layout with phantom emitters (also referred to as dummy emitters), for implementing one or more embodiments. The layout comprises rows of emitters that are offset from adjacent rows above and below so that there is an unoccupied space between emitters. For example, the horizontal distance 1110 between the center of an emitter 1112 in one column to the center of an emitter 1112 in an adjacent column could be longer than the vertical distance 1120 between the centers of emitters in adjacent rows (e.g., 6 microns versus 4.5 microns). These unoccupied spaces correspond to locations of phantom emitters. In some embodiments, phantom emitters can be formed as physical emitters that remain unused. Although the phantom emitters do not generate light, their presence can be accounted for when shifting data between emitters. For example, if data is to be shifted from emitter 1112-A to emitter 1112-B, the data can be shifted after one row time of delay since there is a phantom emitter separating the emitters 1112-A and 1112-B. This delayed shifting was described earlier in connection with FIGS. 4A to 4E. As will now be explained, data shifting arrangements may be provided to accommodate the presence of phantom emitters, using data storage circuits that are configured to temporarily store data for phantom emitters. Such data storage circuits are referred to herein as phantom cells.

Figure 12:
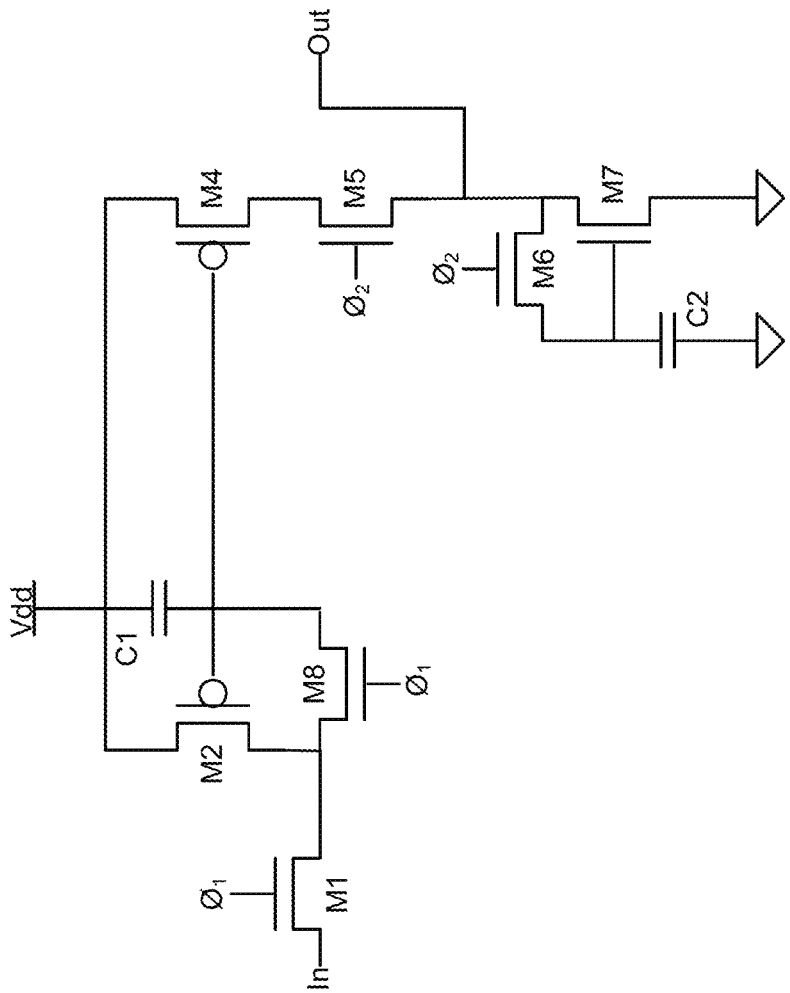
FIG. 12 shows an analog phantom cell, in accordance with an embodiment.

FIG. 12 shows an analog phantom cell 1200, in accordance with an embodiment. The phantom cell 1200 is identical to the emitter cell 900 of FIG. 9, except that the phantom cell 1200 does not include an emitter, and therefore also does not include a transistor M3 for driving the emitter. The phantom cell 1200 can be operated in a similar manner to the emitter cell 900. In particular, during phase 1, $\varnothing_1$ can be asserted to turn on transistors M1 and M8 to cause an input current "In" to be stored as a voltage onto capacitor C1. Then, during phase 2, $\varnothing_2$ can be asserted to turn on transistors M5 and M6 while applying the voltage stored on C1 as a gate voltage onto M4, thereby causing a corresponding voltage to be stored on capacitor C2. The phantom cell 1200 can be connected between two emitter cells (e.g., two instances of emitter cell 900, as shown in FIG. 13) so that the capacitor C2 of the phantom cell 1200 operates as a temporary storage for data being shifted from one emitter cell to the other emitter cell.

Figure 13:
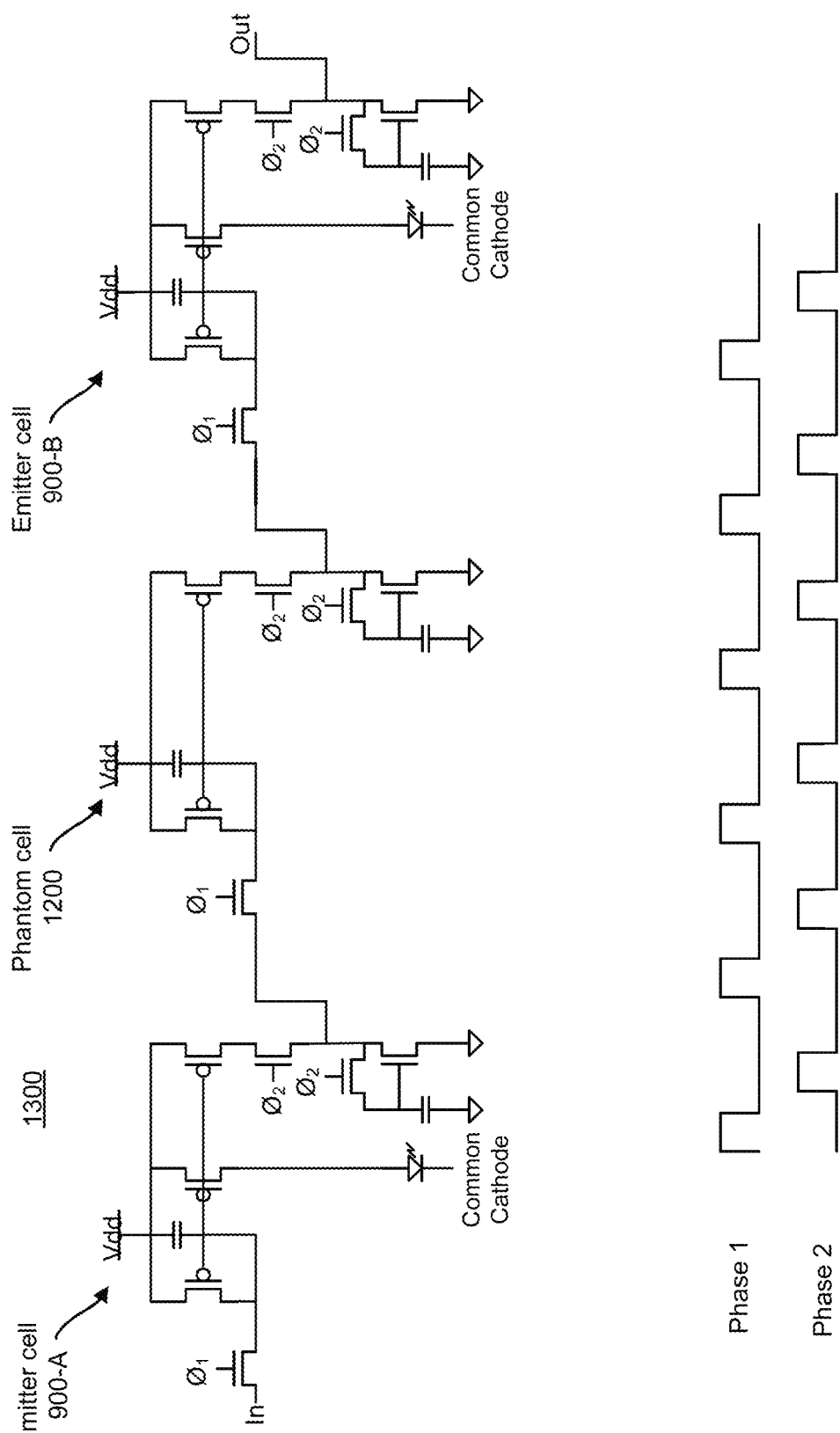
FIG. 13 shows an arrangement of two analog emitter cells and one phantom cell, in accordance with an embodiment.

FIG. 13 shows a circuit 1300 comprising the phantom cell 1200 connected between two instances of emitter cell 900. For simplicity, the labeling of the transistors, capacitors, and emitters has been omitted. FIG. 13 includes an example timing diagram showing the relative timings of phase 1 and phase 2. As shown, phase 1 and phase 2 are offset, with a slight delay between the end of a phase 1 pulse and the beginning of the next phase 2 pulse and vice versa.

Figure 14:
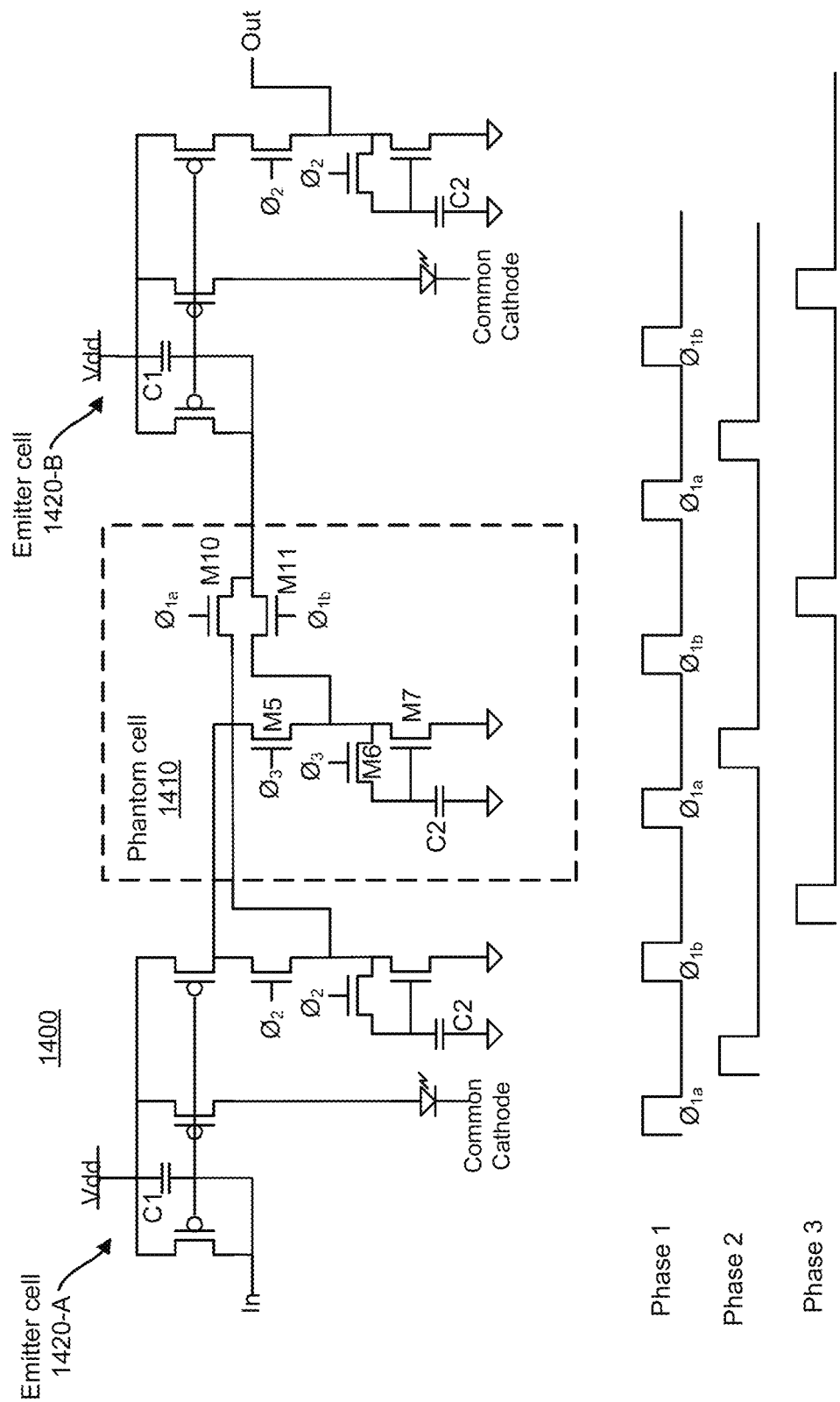
FIG. 14 shows an arrangement of two analog emitter cells and one phantom cell, in accordance with an embodiment.

FIG. 14 shows a circuit 1400 comprising a phantom cell 1410 connected between an emitter cell 1420-A and an emitter cell 1420-B. Like the phantom cell 1200, the phantom cell 1410 can be used to provide a one row time delay in shifting data from a first emitter cell (i.e., emitter 1420-A) to a second emitter cell (i.e., emitter cell 1420-B). The phantom cell 1410 includes a similar data storage block, with a capacitor C2 and transistors M5, M6, and M7 being analogous to C2, M5, M6, and M7 of the phantom cell 1200, respectively. However, the transistors M1 and M2 are controlled using a third timing signal $\varnothing_3$ to implement a third phase of operation. Additionally, the phantom cell 1410 includes a pair of NMOS transistors M10 and M11. The transistors M10 and M11 are controlled on alternating portions (corresponding to timing signals $\varnothing_{1a}$ and $\varnothing_{1b}$) of phase 1.

The emitter cells 1420 are essentially identical to emitter cell 900, except that transistors M1 and M8 are omitted. During the first portion of phase 1, $\varnothing_{1a}$ is asserted to activate M10 and transfer the voltage stored on C2 of emitter cell 1420-A into C1 of emitter cell 1420-B. During phase 2, $\varnothing_2$ is asserted to internally convert, in each emitter cell, the voltage on C1 into a corresponding voltage on C2 while activating both emitters. During the second portion of phase 1, $\varnothing_{1b}$ is asserted to activate M11 and transfer the voltage stored on C2 of the phantom cell 1410 into C1 of the emitter cell 1420-B. During phase 3, $\varnothing_3$ is asserted to turn on M5 and M6 and transfer the voltage stored on C1 of emitter cell 1420-A into C2 of the phantom cell 1410.

From the examples of FIGS. 10, 13, and 14, it will be understood that analog emitter cells with data shifting components can be connected together to form a chain and to shift data sequentially down the chain, with optional phantom cells placed between the emitter cells. Data shifting can be performed using various timing signals (e.g., $\emptyset_1$, $\emptyset_2$, and a common cathode signal). These timing signals may be generated by a display driver such as the display driver 530 of FIG. 5. Examples of digital emitter cells with data shifting components and circuits with data shifting components located outside of emitter cells are discussed below.

Digital Data Shifting

FIG. 15 shows a digital emitter cell 1500 and a digital phantom cell 1550, both with data shifting logic. The emitter cell 1500 includes a pair of PMOS transistors M1 and M2 and an emitter 1510 connected between M2 and a common cathode. The emitter cell 1500 further includes a digital shift register 1515 comprising a plurality of 1-bit shift stages 1512. Each shift stage can be formed using a set of transistors (e.g., six transistors per stage). The number of stages depends on the value to be stored. For example, an 8-bit value can be stored using eight 1-bit shift stages. The shift register 1515 operates to shift data one bit at a time through the shift stages 1512 based on a clock signal. Transistor M2 is controlled by a drive signal applied to the gate of M2. The drive signal determines the magnitude of the current flowing through M2 and thus the current through the emitter 1510. This drive signal may be derived from a current source and replicated using current mirrors for application to additional instances of the emitter cell 1500. While the magnitude of the current through emitter 1510 is determined by the drive signal, the duration of activation of the emitter 1510 is determined by the clock signal. As shown in the bottom of FIG. 15, the clock signal can be set to pulses of varying duration. The pulse durations correspond to binary encoded data values (e.g., from $2^0$ to $2^7$). Thus, the clock signal can be used to control the light output of the emitter 1510 through pulse width modulation.

The phantom cell 1550 includes a digital shift register 1555 comprising 1-bit shift stages 1552 that are analogous to the shift stages 1512 of the shift register 1515. The emitter cell 1500 can be coupled to the phantom cell 1550 by connecting the output of the shift register 1515 to the input of the shift register 1555. Similarly, the output of the shift register 1515 can be connected to the input of a shift register 1515 in another instance of emitter cell 1500 if no phantom cell is required.

Figure 16:
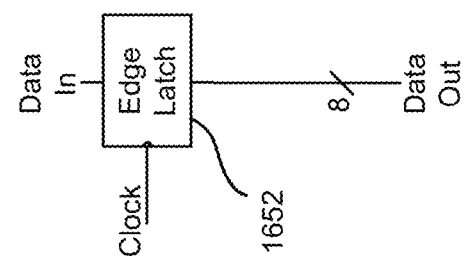
FIG. 16 shows latch based emitter and phantom cells, in accordance with an embodiment.
Figure 16:
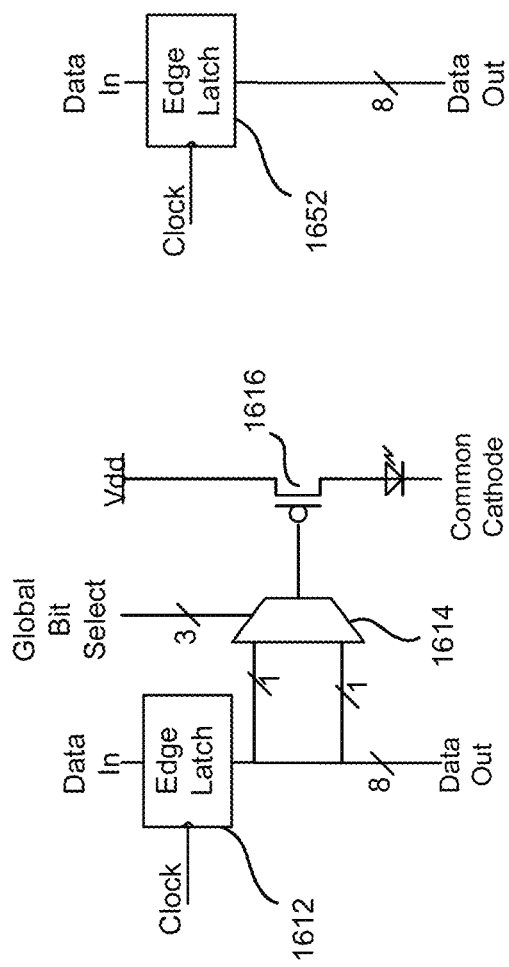
Figure 16:
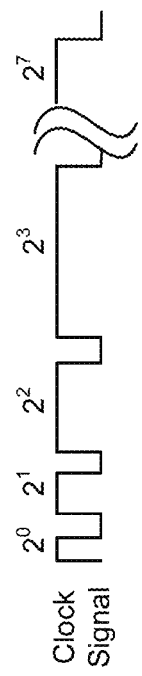

FIG. 16 shows a digital emitter cell 1600 and a digital phantom cell 1650. The emitter cell 1600 and the phantom cell 1650 are latched based implementations that, in contrast to the embodiment of FIG. 15, do not include shift registers. The emitter cell 1600 includes an edge triggered latch 1612 that receives a clock signal and a data signal as inputs. The clock signal and the data signal correspond to the clock and data signals in FIG. 15, except that instead of inputting the data sequentially one bit at a time, the entire data input (e.g., an 8-bit binary value) is latched simultaneously. The latch 1612 operates to temporarily store the data input, which is then multiplexed by a 2-to-1 multiplexer 1614 onto the gate of a PMOS transistor 1616, based on select signal that selects a 1-bit value from the data stored in the latch 1612. The select signal may be a global signal that is applied to other instances of the emitter cell 1600. The phantom cell 1650 includes an edge triggered latch 1652 that receives the same clock and data input signals as the latch 1612. The phantom cell 1650 does not include a multiplexer since no emitter is driven by the data stored in the latch 1652.

Additional Data Shifting Embodiments

Figure 17:
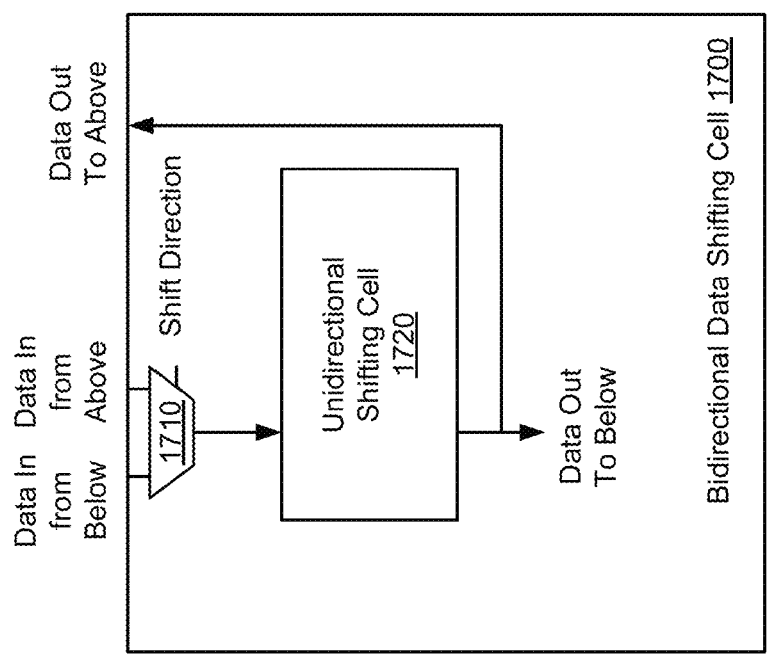
FIG. 17 is a simplified block diagram of a bidirectional data shifting circuit, in accordance with an embodiment.

FIG. 17 is a simplified block diagram of a bidirectional data shifting cell 1700. The embodiments described above provide for unidirectional shifting of data from one emitter cell into the next emitter cell in a series or chain of emitter cells. In some instances, it may be desirable to permit bidirectional data shifting. To accommodate shifting in both directions, a 2-to-1 multiplexer 1710 can combined with a unidirectional shifting cell 1720 (e.g., any of the previously described emitter or phantom cells that include data shifting capabilities). The multiplexer can be controlled to select data from above (e.g., the previous emitter cell) or data from below (e.g., the next emitter cell) for shifting into the unidirectional shifting cell 1720. The shifting direction is determined by a shift direction selection signal. The output of the unidirectional shifting cell 1720 can be supplied both the previous emitter cell and the next emitter cell in order to supply data for bidirectional shifting in those cells as well.

Figure 18:
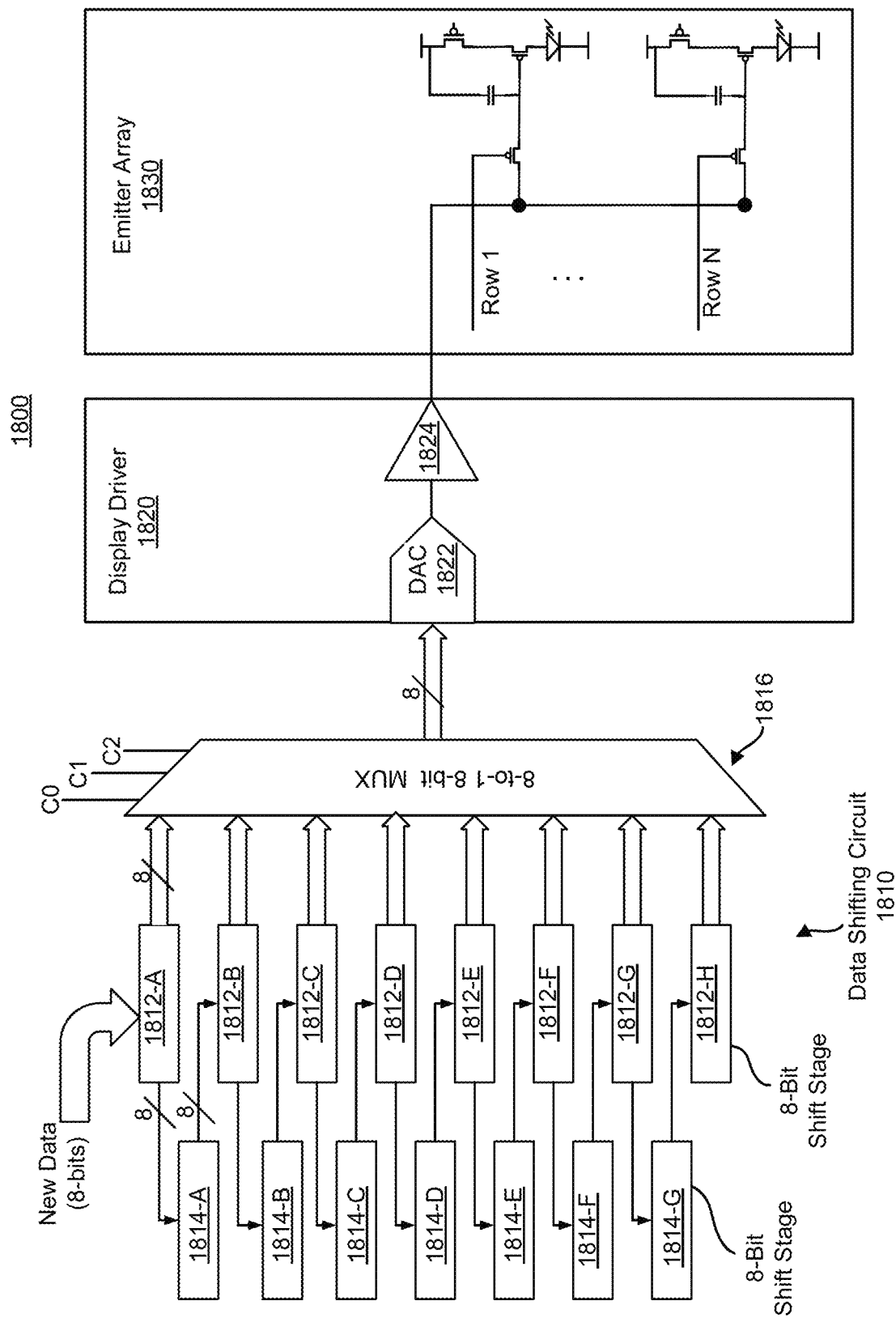
FIG. 18 is a simplified block diagram of a display system including digital data shifting components, in accordance with an embodiment.

FIG. 18 is a simplified block diagram of a display system 1800, which is an embodiment of the display system 500 in FIG. 5. The display system 1800 is an example of a system in which the data shifting components are located separately from the emitter cells. The display system 1800 includes a data shifting circuit 1810, a display driver 1820, and an emitter array 1830.

The data shifting circuit 1810 includes a plurality of shift registers 1812, each of which is assigned to an emitter cell in the emitter array 1830. For example, each shift register 1812 may be an 8-bit shift register implemented, for example, using eight 1-bit stages as shown in the embodiment of FIG. 15. As shown in FIG. 18, the emitter array 1830 can be formed of analog emitter cells such as the emitter cell 700 of FIG. 7. However, the data shifting circuit 1810 can be used in combination with any type of emitter cell, for example, the digital emitter cell of FIG. 8. For illustration purposes, the emitter array 1830 is depicted with only one row of emitter cells.

The data shifting circuit 1810 further includes a plurality of shift registers 1814, each of which is assigned to a phantom cell. The shift registers 1812 and 1814 are connected in alternating fashion. Each of the shift registers 1812 and 1814 is configured to receive a data value (e.g., an 8-bit value) which is sequentially shifted through the entire chain of shift registers. The data value can be generated by a processor of the display diver 1820, which also includes circuitry for driving the emitter array 1830. The values stored in the shift registers 1812 are supplied to a multiplexer 1816, which is shown in the figure as an 8-to-1, 8-bit multiplexer that selects an 8-bit value from one of the eight shift registers 1812 for output to the display driver 1820. The selection of which shift register value to output is based on a selection signal (e.g., a 3-bit signal comprising individual signals C0, C1, and C2), which may be produced by the display driver 1820.

The display driver 1820 includes a digital-to-analog converter (DAC) 1822 and an output buffer 1824 for driving the emitter array 1830. The DAC 1822 operates to convert the digital value output from the multiplexer 1816 into an analog voltage that is input to the output buffer 1824. The output buffer is connected to an entire row of emitter cells so that the current signal produced by the output buffer 1824 can be applied as input to a particular one of the emitter cells by asserting a row selection signal (e.g., the Row Select signal in FIG. 7). The display driver 1820 controls the data shifting circuit 1810 so that the multiplexer 1816 selects an appropriate shift register 1812 for supplying the input to that particular emitter cell.

Data shifting using the circuit 1810 may involve, for example:

During a time period T1, storing a first data value into shift register 1812-A and sending the first data value as output by the shift register 1812-A through the multiplexer 1816 to drive the row 1 emitter;

During a time period T2, shifting the first data value from the shift register 1812-A into shift register 1814-A, storing a second data value into shift register 1812-A, and driving the row 1 emitter using the second data value as output by the shift register 1812-A;

During a time period T3, shifting the first data value from the shift register 1814-A into shift register 1812-B, driving the row 2 emitter using the first data value as output by the shift register 1812-B, shifting the second data value from the shift register 1812-A into shift register 1814-A, storing a third data value into shift register 1812-A, and driving the row 1 emitter using the third data value as output by the shift register 1812-A; and so on. Each column of an emitter array can be provided with its own instance of the data shifting circuit 1810 to allow for storage of data for the emitters of that column. However, some components may be shared by two or more columns (e.g., the DAC 1822 can be shared).

Figure 19:
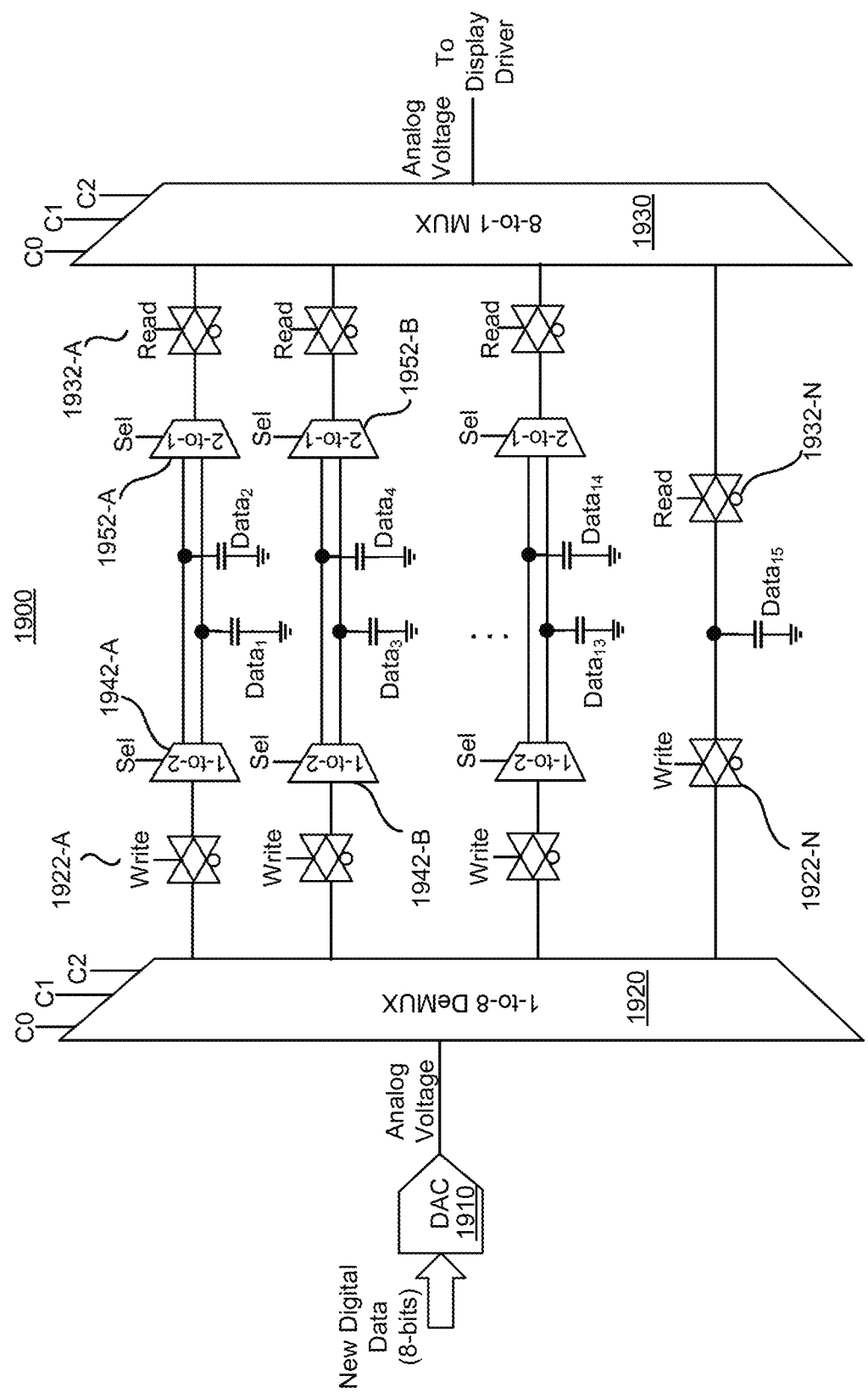
FIG. 19 is a simplified block diagram of a display system including analog data shifting components, in accordance with an embodiment.

FIG. 19 is a simplified block diagram of an analog data shifting circuit 1900. Like the data shifting circuit 1810 of FIG. 18, the data shifting circuit 1900 is located separately from the emitter cells of an emitter array. The data shifting circuit 1900 includes a DAC 1910, a demultiplexer 1920, a multiplexer 1930, a set of write gates 1922, and a set of read gates 1932. The gates 1922 and 1932 are transmission gates. The DAC 1910 is configured to receive digital input data (e.g., an 8-bit value from a display driver) and convert the digital input into an analog representation (e.g., an analog voltage) that is input to the demultiplexer 1920.

The demultiplexer 1920 is configured to output the analog voltage to one of the write gates 1922 based on a selection signal (e.g., C0, C1, and C2). For example, the demultiplexer 1920 can be a 1-to-8 demultiplexer that is connected to eight write gates 1922, each associated with a particular emitter row. Except for the last write gate 1922-N, each write gate 1922 is operable to connect the output of the demultiplexer 1920 to the input of a corresponding 1-to-2 demultiplexer 1942. Each demultiplexer 1942 is in turn connected at its output to a 2-to-1 multiplexer 1952.

Connected between each demultiplexer-multiplexer pair 1942, 1952 is a pair of storage capacitors, each of which is operable to store an analog data value supplied by a demultiplexer 1942. The selection input of the demultiplexer 1942 determines which capacitor of the pair of storage capacitors receives the output of the demultiplexer 1942. The values stored on the capacitors can be read out using the multiplexers 1952, which are connected at their outputs to corresponding ones of the read gates 1932. The last write gate 1922-N is directly connected at its output to a read gate 1932-N, with only one storage capacitor connected in between. For a column of eight emitters, a total of fifteen data capacitors can be used to temporarily store data values for shifting into the emitters, one for each of the eight emitters and one for each seven phantom emitters connected between the emitters.

The multiplexer 1930 is configured to read the voltage stored on the data capacitors and to select (e.g., based on the same control signal used for the demultiplexer 1920) one of the stored voltages for output to the display driver (not shown). Since the voltage output by the demultiplexer is analog, no digital-to-analog conversion is required. Instead, the display driver may simply buffer the analog voltage through an output buffer and into a selected emitter in an emitter array (e.g., to a particular row in a column of emitters). As with the display system 1800, the emitters cells of the emitter array can be analog emitter cells or digital emitter cells.

Additionally, it can be seen that unlike the data shifting circuit 1810, there is no internal shifting of data within the data shifting circuit 1900. Instead, data is simply written to and read out of appropriate capacitors. At any given time, an entire column's worth of data can be made available for selecting an appropriate analog value for driving a corresponding emitter. The data shifting circuit 1900 can be programmed by controlling the demultiplexer 1920 to store a charge onto a selected capacitor (e.g., storing $Data_1$) while simultaneously outputting the charge from the same selected capacitor through the multiplexer 1930 to a selected emitter. This storage and driving process can be repeated for the remaining emitters of the column.

Data shifting using the circuit 1900 may involve, for example:

During a time period T1, storing $Data_1$ on a first capacitor and using $Data_1$ to drive the row 1 emitter;

During a time period T2, storing $Data_2$ on a second capacitor, using $Data_1$ to drive the row 2 emitter, and using $Data_2$ to drive the row 1 emitter (if the row 2 emitter is a phantom emitter, then $Data_1$ may not need to be read into the multiplexer 1930);

During a time period T3, storing $Data_3$ on a third capacitor and using $Data_1$, $Data_2$, and $Data_3$ to drive the row 3, row 2, and row 1 emitters, respectively; and so on.

After the final data value (e.g., $Data_{15}$) has been stored, a new $Data_1$ can be stored (overwriting the previous value on the first capacitor) for driving the row 1 emitter of the same column. As with the data shifting circuit 1810, each column of an emitter array can be provided with its own instance of the data shifting circuit 1900, but some components may be shared by two or more columns (e.g., the DAC 1910).

Feedback Circuit

FIG. 20 is a simplified block diagram of a display system 2000 with feedback collection capabilities. The system 2000 includes a display driver 2010 and a driving circuit 2020. The driving circuit 2020 can be formed using any of the earlier described analog or digital emitter cells and, as shown in the figure, has a set of emitter cells 2012 arranged in an array (e.g., in the same row and column configuration as the physical emitters that are driven by the emitter cells 2012). The emitters driven by the emitter cells 2012 are connected to a common cathode 2015. For simplicity, only one emitter 2014 is shown. The display system 2000 includes data shifting components (not shown) which, as described in connection with the embodiments above, can be integrated into the emitter cells or separately located in another area of the display system. As explained previously, the emitter cells can be connected in a chain to form a column, so that data is sequentially shifted from the emitter cell in the first row to the emitter cell in the last row. Thus, the emitter 2014 may correspond to the last emitter to be driven based on a digital data value (or an analog representation thereof) supplied by the display driver 2010 for driving the emitters of a column 2017. The columns comprise emitter cells used for driving emitters of the same color. Additional columns exist for driving other color emitters, but are omitted from the figure.

The display driver 2010 is configured to independently control a pair of switches 2025 and 2027 that are connectable to the last emitter cell 2012-N of the column 2017 (e.g., column 1 of M columns). More specifically, the switches 2025 and 2027 are respectively connectable to an anode and a cathode 2015 of the emitter 2014. The cathode 2015 can be a common cathode shared by all of the columns. The switches 2025 and 2027 can be implemented as transistors (e.g., a pair of NMOS transistors). An analogous pair of switches can be provided for each remaining column in order to enable testing of those columns. Also depicted is a fictitious current source 2022 connected between the emitter 2014 and the common cathode 2015. The current source 2022 represents a bias current that is developed as a result of shifting a test value through the entire column 2017. Thus, the current source 2022 is controllable based on the test value that is input to the column. The display driver 2010 may select the test value to be any non-zero data value for which the expected feedback characteristics can be obtained by the feedback processing unit 2019.

To perform a feedback analysis, the display driver 2010 can set the common cathode 2015 to a floating voltage while maintaining the switch 2025 open and the switch 2027 closed. In this configuration, current from the current source 2022 will flow through the emitter 2014 and into a feedback path 2050. Further, if the data inputs to the remaining columns are set to zero (i.e., if the only data being shifted is the test value, and only through the column 2017) then the current through the feedback path 2050 will be indicative of whether the emitter 2014 is passing current in correct proportion to the test value.

The feedback processing unit 2019 can be implemented in hardware, software, or a combination thereof. The feedback processing unit 2019 may be configured to compare the current in the feedback path 2050 to an expected current that is associated with the test value. This expected current can, for example, be a stored reference current that was measured at a time when the column 2017 was functioning properly, i.e., a historical current. Alternatively, the expected current may be a stored value determined based on a design specification for the driving circuit 2020.

As another type of feedback analysis, the display driver 2010 can apply a voltage bias to the common cathode 2015 while maintaining the switch 2025 closed and the switch 2027 open. In this configuration, the feedback path 2050 can be used to measure the voltage developed across the emitter 2014. Thus, the feedback path 2050 can be defined based on the opened/closed configuration of the switches 2025 and 2027, depending on which electrical characteristic is of interest. Similar to the configuration for measuring a feedback current, an expected voltage can be stored for comparison to the measured voltage by the feedback processing unit 2019.

The feedback processing unit 2019 may analyze feedback to determine the overall health of the column 2017. Because the emitter cells 2012 of the column 2017 are all connected, each emitter cell in the column contributes to the measured current or measured voltage, which is therefore indicative of the performance of the column as a whole. The feedback processing unit 2019 may determine, based on the measured current/voltage value being different than the expected current/voltage, that there is a problem somewhere in the column 2017. A deviation from the expected current/voltage can be caused, for example, by a manufacturing defect, inherent variations among components having the same design specification, or performance degradation caused by aging of components. The source of the deviation can be any component in an emitter cell of the column 2017 including, for example, a transistor involved in generating the current represented by current source 2022, a storage capacitor, or an emitter. Because the measured signal is not specific to any individual emitter cell, the feedback processing unit 2019 cannot determine the exact location of the problem. Nevertheless, the display driver 2010 can be adjusted to correct the problem by, for example, increasing the data value for subsequent inputs to the column 2017 if the measured current is less than the expected current. For example, the feedback processing unit 2019 may calculate the increase by determining, based on the amount by which the measured current is lower than the expected current, that two of the emitter cells in the column are defective (e.g., based on the assumption that each emitter cell contributes equally to the measured current or voltage when every emitter cell is fully functioning). The display driver 2010 can then compensate for the current difference by increasing the data input by an amount corresponding to the current difference divided by the total number of non-defective emitter cells in the column.

Feedback analysis can be used to compensate for manufacturing defects and differences in device tolerances of the various electrical components that make up the driving circuit 2020. Feedback analysis can also be performed occasionally throughout the life of the display system 2000. For example, the display driver 2010 can be configured to automatically perform feedback analysis at regular intervals in order to monitor the health of the driving circuit 2020. Feedback can be collected while the display is being scanned to produce an output image for viewing by a user. Feedback can also be collected without producing an output image (e.g., shifting a test value through one or more columns while the scanning assembly is kept stationary). Performance degradations due to aging of components in the driving circuit 2020 (including aging of the physical emitters) can therefore be timely detected and compensated for.

In some embodiments, there are multiple pairs of switches in a column. For example, each emitter can be connectable to a respective pair of switches, each pair of switches being connected to a separate feedback path to enable measurements specific to the emitter cell that drives that particular emitter. However, it is generally unnecessary to obtain precise information on which particular emitter cell has a problem when the contributions of the emitter cells are aggregated, e.g., by shifting data through an entire column in accordance with the embodiments described earlier.

Figure 21:
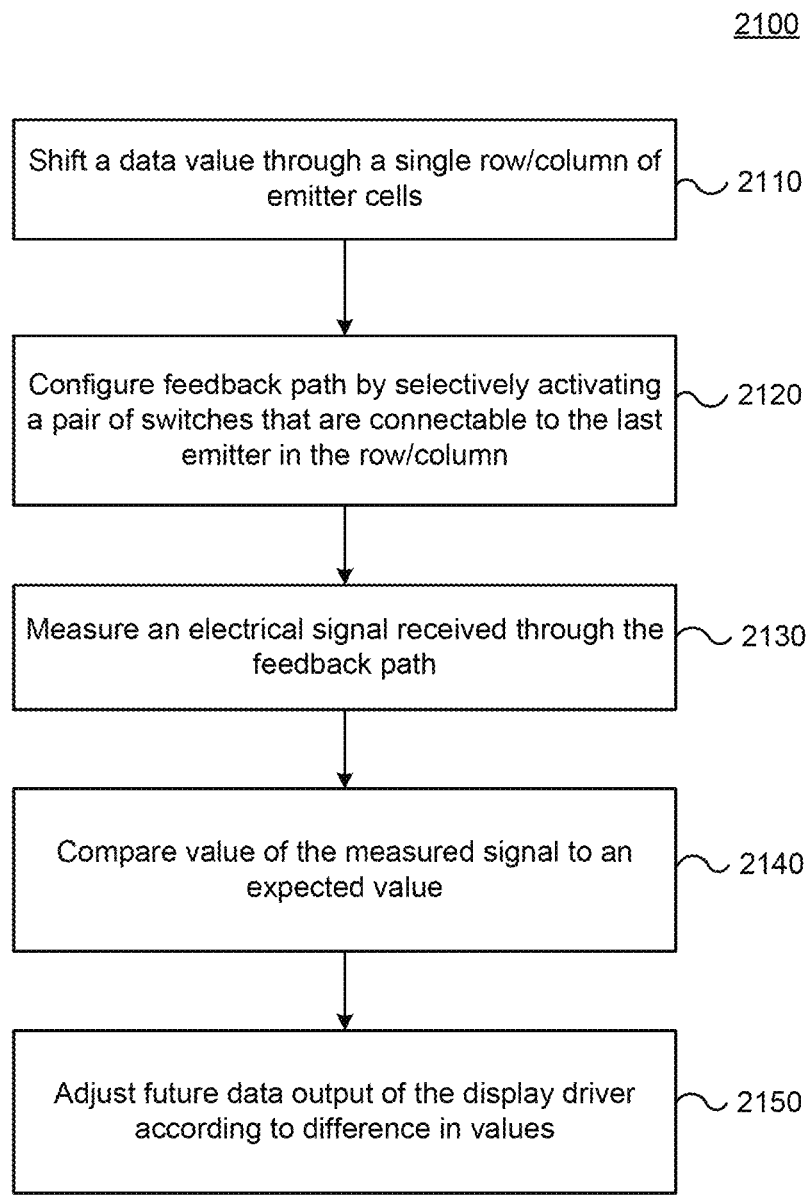
FIG. 21 is a flowchart of a method for calibrating a driving circuit, in accordance with an embodiment.

FIG. 21 is a flowchart of a method 2100 for calibrating a driving circuit. The method 2100 can be performed using the display system 2000. At step 2110, a data value is shifted through a single row or column of emitter cells. The data value can be any non-zero value. The display driver 2010 may select the data value from a set of historical or programmed data values that are stored in a memory. For example, the data value could be stored in a table that maps the data value to an expected current or voltage. The remaining rows or columns are set to zero while the data value is shifted.

At step 2120, the display driver 2010 configures a feedback path leading from the last emitter of the row/column through which the data value was shifted in step 2110. The display driver 2010 may configure the feedback path by selectively opening or closing a pair of switches that are connectable to the last emitter. As explained above in connection with FIG. 20, the open/closed configuration of the switches can be used to perform a particular type of measurement (e.g., a measurement of a current or a measurement of a voltage).

At step 2130, the feedback processing unit of the display driver 2010 measures a signal received through the feedback path. The measurement process may include storing a representation of the measured signal (e.g., converting a measured current into a digital value using an analog-to-digital converter or storing the measured current as a voltage on a capacitor).

At step 2140, the feedback processing unit compares the value of the measured signal to the expected value. The comparison may involve performing one or more computations (e.g., subtracting one value from the other to determine the difference between the two values). In some embodiments, the comparison is performed using a general purpose processor (e.g., a central processing unit of a computer). In other embodiments, the comparison is performed using dedicated circuitry (e.g., an analog comparator).

At step 2150, future data output of the display driver 2010 is adjusted according to the difference between the two values. For example, as explained earlier, the value of data subsequently shifted into the same row/column can be increased by an amount calculated based on the difference between the measured and expected values, and further based on the assumption that the emitter cells contribute equally to measured current or voltage when all the emitter cells of the row/column are fully functional. The feedback processing unit may determine, based on the difference between the two values, how many emitter cells are defective and may set the increase based on the number of emitter cells that are non-defective. For example, if the measured current is less than the expected current by 200 micro-amps and there are five non-defective emitter cells, subsequent inputs to the row/column can be increased by a data value that results in application of an additional 40 micro-amps. Since the data value is shifted through each emitter cell in the row/column, the total additional current generated will be 5×40 micro-amps or 200 micro-amps. The data value can be similarly decreased if needed.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. Although the steps, operations, or processes are described in sequence, it will be understood that in some embodiments the sequence order may differ from that which has been described, for example with certain steps, operations, or processes being omitted or performed in parallel or concurrently. In some embodiments, a software module is implemented with a computer program product comprising a computer-readable medium containing computer program code, which can be executed by one or more computer processors for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A display system, comprising:
   an emitter array including a plurality of emitters arranged in a column;
   a display driver circuit configured to individually drive the plurality of emitters; and
   a data shifting circuit including a plurality of storage elements and a multiplexer, wherein the data shifting circuit is configured to:
   store digital data or an analog representation of the digital data into a first storage element of the plurality of storage elements; and
   output the digital data or analog representation to the display driver circuit from the multiplexer, wherein:
   the digital data or analog representation is output multiple times,
   each time the digital data or analog representation is output from the multiplexer, the multiplexer obtains the digital data or analog representation from a different storage element or from the first storage element,
   each instance of output from the multiplexer forms an input signal that causes a drive current to be applied to a different emitter such that every emitter in the plurality of emitters emits light according to the same drive current but at different times, and
   over time the light emitted by every emitter in the plurality of emitters according to the same drive current is reflected onto an eye of a user to be perceived as a single pixel of an output image.

2. The display system of claim 1, further comprising:
   a scanning assembly including a reflective surface that rotates to form the output image by reflecting light emitted from the plurality of emitters, and wherein at different angles of rotation of the reflective surface, light from different ones of the plurality of emitters is reflected to contribute to a brightness of a same pixel in the output image.

3. The display system of claim 1, wherein the first storage element stores the digital data, wherein each storage element of the plurality of storage elements is a shift register, and wherein the data shifting circuit is configured to sequentially shift the digital data through the shift registers.

4. The display system of claim 3, wherein the multiplexer obtains the digital data from a different one of the shift registers each time the digital data is output to the display driver circuit.

5. The display system of claim 1, wherein the digital data is output to the display driver circuit, and wherein the display driver circuit includes a digital-to-analog converter that converts the digital data into an analog input signal by which a selected emitter of the plurality of emitters is driven.

6. The display system of claim 1, wherein the display driver circuit is configured to use the digital data or analog representation to sequentially drive the plurality of emitters from one row to the next row until the entire column has been driven.

7. The display system of claim 1, wherein the first storage element stores the analog representation of the digital data, and wherein each storage element of the plurality of storage elements is a capacitor.

8. The display system of claim 7, wherein the data shifting circuit reads from the first storage element each time the analog representation of the digital data is output to the display driver circuit.

9. The display system of claim 7, wherein the capacitors store analog representations of different digital data values, and wherein the plurality of emitters are driven using the analog representations of different digital data values.

10. A data shifting circuit for driving a plurality of emitters in a display, comprising:
a plurality of storage elements including a first storage element configured to store digital data or an analog representation of the digital data; and
a multiplexer configured to output the digital data or analog representation to a display driver circuit multiple times, wherein:
each time the digital data or analog representation is output from the multiplexer, the multiplexer obtains the digital data or analog representation from a different storage element or from the first storage element,
the display driver circuit is configured to use each instance of output from the multiplexer to form an input signal that causes a drive current to be applied to a different emitter such that every emitter in the plurality of emitters emits light according to the same drive current but at different times, and
over time the light emitted by every emitter in the plurality of emitters according to the same drive current is reflected onto an eye of a user to be perceived as a single pixel of an output image.

11. The data shifting circuit of claim 10, wherein the plurality of emitters are driven in synchronization with a rotation of a reflective surface that forms the output image by reflecting light emitted from the plurality of emitters, such that at different angles of rotation of the reflective surface, light from different ones of the plurality of emitters is reflected to contribute to a brightness of a same pixel in the output image.

12. The data shifting circuit of claim 10, wherein the first storage element stores the digital data, wherein each storage element of the plurality of storage elements is a shift register, and wherein the data shifting circuit is configured to sequentially shift the digital data through the shift registers.

13. The data shifting circuit of claim 12, wherein the multiplexer obtains the digital data from a different one of the shift registers each time the digital data is output to the display driver circuit.

14. The data shifting circuit of claim 10, wherein the first storage element stores the analog representation of the digital data, and wherein each storage element of the plurality of storage elements is a capacitor.

15. The data shifting circuit of claim 14, wherein the data shifting circuit reads from the first storage element each time the analog representation of the digital data is output to the display driver circuit.

16. The data shifting circuit of claim 14, wherein the capacitors store analog representations of different digital data values, and wherein the plurality of emitters are driven using the analog representations of different digital data values.

17. The data shifting circuit of claim 16, further comprising:
a demultiplexer configured to send each analog representation to a selected capacitor on which the analog representation is stored.

18. The data shifting circuit of claim 10, wherein the plurality of emitters includes a phantom emitter, and wherein the plurality of storage elements includes a storage element that stores digital data or an analog representation thereof for the phantom emitter.

19. A display system, comprising:
an emitter array including a plurality of emitters arranged in a column, wherein the plurality emitters are of a same color;
a display driver circuit configured to individually drive the plurality of emitters using digital data values or analog representations of digital data values;
a scanning assembly including a reflective surface that receives light from the emitter array, the scanning assembly forming an output image by rotating the reflective surface in synchronization with driving of the plurality of emitters; and
a data shifting circuit located separately from the emitter array, the data shifting circuit including a plurality of storage elements that collectively provide storage for the entire column, wherein the data shifting circuit is configured to:
receive digital data or an analog representation of the digital data;
store the digital data or analog representation into a first storage element of the plurality of storage elements; and
output the digital data or analog representation to the display driver circuit multiple times, wherein:
each time the digital data or analog representation is output, the digital data or analog representation is obtained from a different storage element or from the first storage element,
the display driver circuit is configured to use each instance of the digital data or analog representation to form an input signal that causes a drive current to be applied to a different emitter such that every emitter in the plurality of emitters emits light according to the same drive current but at different times, and
the scanning assembly is configured to form the output image over time through reflecting the light emitted by every emitter in the plurality of emitters according to the same drive current onto an eye of a user to be perceived as a single pixel of the output image.

* * * * *